(12) United States Patent
Yamaoka et al.

(10) Patent No.: US 7,639,525 B2
(45) Date of Patent: Dec. 29, 2009

(54) SEMICONDUCTOR MEMORY DEVICE

(75) Inventors: Masanao Yamaoka, Kodaira (JP); Takayuki Kawahara, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/541,542

(22) Filed: Oct. 3, 2006

(65) Prior Publication Data

US 2007/0076467 A1    Apr. 5, 2007

(30) Foreign Application Priority Data

Oct. 4, 2005    (JP) ............... 2005-290889

(51) Int. Cl.
*G11C 11/00* (2006.01)
*G11C 5/06* (2006.01)
*G11C 11/34* (2006.01)
*G11C 5/14* (2006.01)

(52) U.S. Cl. .................. 365/154; 365/72; 365/174; 365/189.09

(58) Field of Classification Search .......... 365/154, 365/155, 156, 72, 174, 189.09
See application file for complete search history.

(56) References Cited

U.S. PATENT DOCUMENTS

| | | | |
|---|---|---|---|
| 5,986,924 A * | 11/1999 | Yamada | 365/154 |
| 6,643,173 B2 | 11/2003 | Takemura | |
| 6,898,111 B2 | 5/2005 | Yamauchi | |
| 2003/0223276 A1* | 12/2003 | Yamaoka et al. | 365/189.09 |
| 2006/0157738 A1* | 7/2006 | Kawanaka | 257/207 |
| 2007/0029607 A1* | 2/2007 | Kouznetzov | 257/321 |
| 2008/0055967 A1* | 3/2008 | Houston et al. | 365/154 |

FOREIGN PATENT DOCUMENTS

| | | |
|---|---|---|
| JP | 11-039879 A | 2/1999 |
| JP | 2003-86713 A | 3/2003 |
| JP | 2003-151277 A | 5/2003 |

* cited by examiner

*Primary Examiner*—Ly D Pham
(74) *Attorney, Agent, or Firm*—Miles & Stockbridge P.C.

(57) ABSTRACT

A semiconductor memory device for reducing the power consumption of an entire low power consumption SRAM LSI circuit employing scaled-down transistors and of increasing the stability of read and write operations on the memory cells by reducing the subthreshold leakage current and the leakage current flowing from the drain electrode to the substrate electrode is provided. The semiconductor memory device also prevents an increase in the number of transistors in a memory cell and thereby preventing an increase in the cell area, and ensures stable operation of an SRAM memory cell made up of SOI or FD-SOI transistors having a BOX layer by controlling the potentials of the wells under the BOX layers of the drive transistors.

13 Claims, 30 Drawing Sheets

FIG.30

|  | READ | | WRITE | | STAND-BY | |
| --- | --- | --- | --- | --- | --- | --- |
|  | Vbn | Vbn | Vbn | Vbn | Vbn | Vbn |
| PATTERN1 | 0V | 0V | 1.0V | 1.0V | 0V | 1.0V |
| PATTERN2 | 1.0V | 0V | 1.0V | 1.0V | 0V | 1.0V |
| PATTERN3 | 0V | 0V | 1.0V | 1.0V | 0V | 2.5V |
| PATTERN4 | 0V | 0V | 1.0V | 1.0V | -1.0V | 2.5V |
| PATTERN5 | 0V | 0V | 2.5V | 1.0V | 0V | 1.0V |
| PATTERN6 | 2.5V | 0V | 2.5V | 1.0V | 0V | 1.0V |

FIG.31

|  | Tox | Tbox | Vdd | VBP |
| --- | --- | --- | --- | --- |
| PATTERN1 | 2.0nm | 10nm | 1.2V | 2.5V |
| PATTERN2 | 2.0nm | 10nm | 1.2V | 6.0V |
| PATTERN3 | 1.2nm | 10nm | 1.0V | 6.0V |
| PATTERN4 | 1.2nm | 20nm | 1.0V | 12.0V |
| PATTERN5 | 1.2nm | 5.0nm | 1.0V | 2.5V |
| PATTERN6 | 1.2nm | 5.0nm | 1.0V | 4.0V |
| PATTERN7 | 1.2nm | 2.4nm | 1.0V | 1.8V |

SEMICONDUCTOR MEMORY DEVICE

CLAIM OF PRIORITY

The present application claims priority from JP2005-290889, filed on Oct. 4, 2005, the content of which is hereby incorporated by reference into this application.

BACKGROUND OF THE INVENTION

1. Field of the Invention

The present invention relates to a semiconductor integrated circuit in which a static memory (SRAM) circuit is integrated on a semiconductor chip, and more particularly to a configuration of an SRAM integrated circuit device that allows operating margins to be increased.

2. Description of the Related Arts

In recent years, there has been a strong need to increase the speed of semiconductor devices such as SRAM circuits, as well as reducing their power consumption.

FIG. 32 shows a conventional SRAM memory cell circuit. Referring to the figure, symbols BLT and BLB denote bit lines; WL, a word line; Vdd, a high level power supply line; and Vss, a ground line. Further, reference numerals 201 and 202 denote transfer transistors used to access the memory cell; 203 and 204, drive transistors for driving storage nodes to store data in the memory cell; 205 and 206, load transistors for supplying charge to store data in the memory cell; and 207 and 208, the storage nodes.

The simplest and most effective method for reducing the power consumption of an SRAM circuit is to reduce its power supply voltage.

However, a reduction in the power supply voltage results in a reduction in the operating margins of the transistors, leading to unstable operation. To solve this problem, the following techniques have been disclosed. Japanese Laid-Open Patent Publication No. 11-39879 (patent document 1) discloses a technique of controlling the substrate potential of transistors making up an SRAM cell to increase the speed in a write operation and reduce the power consumption in a read operation. Japanese Laid-Open Patent Publication No. 2003-151277 (patent document 2) discloses a circuit technique of forming a high speed, low voltage memory cell by using two types of transistors having different threshold voltages Vth. Further, Japanese Laid-Open Patent Publication No. 2003-86713 discloses a technique of producing an SRAM memory cell that can operate at a low voltage and that is resistant to data destruction by forming transistors of the memory cell such that those transistors connected to one storage node have a larger gate width than those connected to the other storage node.

SUMMARY OF THE INVENTION

The power supply voltage of LSIs (Large Scale Integrated Circuits) has been reduced to reduce the power consumption and the size of their transistors. For example, the 90 nm process produces LSIs operating at a power supply voltage of 1.2 V. In the case of an SRAM circuit, a reduction in the power supply voltage degrades the operating stability during read and write operations, which may result in operational failure. If the driving power (or current) of each transistor making up a memory cell changes, so does the performance of the cell in terms of stability of read and write operations and operating speed.

Therefore, the performance characteristics of each transistor in a memory cell may be appropriately controlled to maximize the performance of the cell. Reducing the power supply voltage of the cell results in a reduction in the drive current of the transistors and in the operating speed of the circuit. To prevent such a reduction in the operating speed when the power supply voltage is lowered, the threshold voltage (Vth) of the transistors may be reduced to maintain their operating current level.

However, reducing the threshold voltage (Vth) of a transistor increases the leakage current flowing between the source and drain of the transistor in the off state (or when it is turned off), resulting in increased power consumption. (This leakage current is referred to as a "subthreshold leakage current".) The technique disclosed in the above patent document 1 controls the substrate potential of appropriate transistors in an SRAM memory cell and thereby controls the performance of these transistors in order to reduce their power consumption in the off state. More specifically, in the case of an n-channel bulk CMOS transistor, a voltage lower than the source electrode voltage may be applied to the back gate to increase the threshold voltage Vth of the transistor and thereby reduce the subthreshold leakage current.

However, if the back gate of a scaled-down bulk CMOS transistor manufactured by a 90 nm or less process is controlled in such a manner, the leakage current flowing from the drain electrode to the substrate electrode (called the junction leakage current) increases. As a result, the total leakage current of the transistor increases although the subthreshold leakage current is reduced, preventing the entire circuit from achieving reduced power consumption.

The technique disclosed in the above patent document 2 employs a larger number of transistors to form a memory cell, and these transistors are divided into two types each having a different threshold voltage Vth. With this arrangement, the driving power of each transistor in the memory cell is appropriately set to enhance the stability of read and write operations on the memory cell.

However, an increase in the number of devices (transistors) in a memory cell results in an increase in the memory cell area. Therefore, this type of memory cell is not useful in terms of increasing the memory capacity of a memory circuit.

The technique disclosed in the above patent document 3 forms transistors of a memory cell such that those transistors connected to one stage node have a larger gate width than those connected to the other storage node. With this arrangement, the driving power of each transistor in the memory cell is appropriately set to increase the stability of read and write operations on the memory cell.

However, a memory cell having this configuration is not symmetrical, since the transistors connected to the two storage nodes are formed to have different gate widths, as described above. This is disadvantageous since a memory cell manufacturing process basically requires that a large number of symmetrical memory cells be regularly arranged. The lack of symmetry leads to a degradation in the manufacturing accuracy and in the performance of the memory cell. Further, a memory cell made up of transistors having different gate widths has increased memory cell area, which is the same problem as that suffered by the example described in the patent document 2.

It is, therefore, an object of the present invention to provide a technique of reducing the power consumption of an entire low power consumption SRAM LSI circuit employing scaled-down transistors by reducing the subthreshold leakage current and the leakage current flowing from the drain electrode to the substrate electrode.

Another object of the present invention is to provide a technique of enhancing the operating stability of a memory cell during read and write operations.

Still another object of the present invention is to provide a technique of preventing an increase in the number of transistors in a memory cell and thereby preventing an increase in the cell area and hence in the chip area.

The following are exemplary aspects of the present invention. According to one aspect of the present invention, a semiconductor memory device comprises: a static memory cell including a latch portion and a transfer portion, the latch portion storing data, the transfer portion transferring the data; wherein the latch and transfer portions each include a transistor including an SOI layer whose channel portion is insulated from a substrate portion by a BOX layer made up of an insulation layer; and wherein when data is written to or read from the memory cell, the threshold voltage of at least one transistor within the memory cell is changed.

Thus, the static memory cell includes SOI transistors, and the potential of the well layer under the BOX (Buried Oxide) layer of each transistor may be adjusted to adjust the current of the transistor and thereby enhance each performance characteristic of the SRAM. This configuration does not increase the leakage current, since the well layer is electrically insulated by the BOX layer from the SOI layer in which the transistor is formed.

According to another aspect of the present invention, a semiconductor memory device functioning as a static memory cell comprises: a plurality of SOI transistors each including a well layer made up of a conductive layer and formed on a semiconductor substrate, a BOX layer made up of an insulation layer and formed on the well layer, a source layer and a drain layer that are formed on the BOX layer, a channel layer sandwiched between the source and drain layers, and a gate electrode formed on the channel layer with a gate insulation layer therebetween; a pair of drive transistors each made up of one of the plurality of SOI transistors and including a channel of a first conductive type and a source electrode that is connected to a ground line; a pair of load transistors each made up of one of the plurality of SOI transistors and including a channel of a second conductive type, a source electrode, and a drain electrode, the source electrode being connected to a first power supply line higher in potential than the ground line, the drain electrode being connected to one of the pair of drive transistors; and a pair of transfer transistors each made up of one of the plurality of SOI transistors and including a channel of the first conductive type, each transfer transistor being connected between a bit line for accessing the memory cell and a storage node for storing information; wherein a well layer in which one of the pair of drive transistors is formed and a well layer in which one of the pair of transfer transistors is formed are provided on a first common well layer; wherein the pair of load transistors are provided on a second common well layer; and wherein the first and second common well layers are electrically isolated from each other.

This configuration prevents an increase in the memory cell area if the well contacts are appropriately formed.

According to still another aspect of the present invention, a semiconductor memory device functioning as a memory cell array comprises: static memory cells arranged in row and column directions, each static memory cell including a plurality of transistors; a plurality of bit lines for accessing the memory cells; a first well layer in which transistors of a plurality of memory cells are formed, the transistors being connected together to one of the plurality of bit lines and formed in the same column; and a second well layer in which other transistors of the plurality of memory cells are formed, the other transistors being connected together to another one of the plurality of bit lines and formed in the same column; wherein the potentials of the first and second well layers are adjusted to different values.

This configuration allows two different power supply voltages to be selectively applied to specific nodes to change the currents of transistors and thereby improve their performance characteristics.

The present invention allows transistors to have an increased operating speed and a reduced leakage current, which leads to improvements in the operating characteristics of the SRAM circuit.

BRIEF DESCRIPTION OF THE DRAWINGS

FIG. 30 is a diagram showing the voltage relationship between well nodes in SRAM according to the present invention.

FIG. 31 is a diagram showing the relationship between layer thicknesses and the voltage applied to a well node.

DETAILED DESCRIPTION OF THE PREFERRED EMBODIMENTS

The present invention will now be described with reference to the accompanying drawings.

First Embodiment

Figure 1:
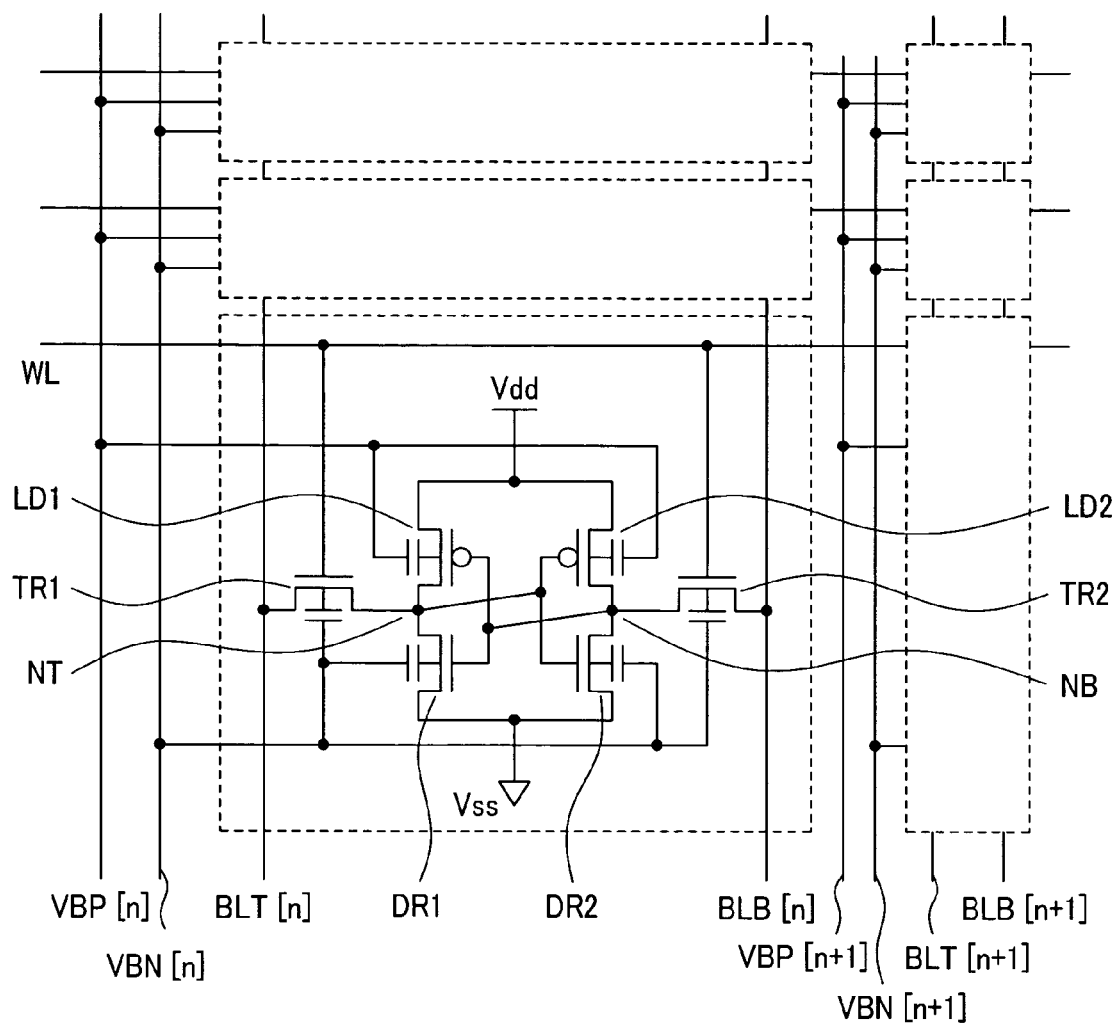
FIG. 1 is a schematic diagram showing the circuit configuration of an SRAM memory cell according to the present invention.

FIG. 1 shows a circuit diagram of an SRAM circuit according to a first embodiment of the present invention. In the figure, [n] indicates the nth column and [n+1] indicates the (n+1)th column. For example, VBN[n] denotes an n-well node to which are connected the wells of the nMOS transistors in all nth-column memory cells (as described below). Such a notation will be used as necessary throughout this specification. Referring to FIG. 1, symbols BLT and BLB denote bit lines; WL, a word line; Vdd, a high level power supply line; Vss, a ground line; NT and NB, data storage nodes for storing data; TR1 and TR2, transfer transistors connected between the bit lines and the data storage nodes; DR1 and DR2, drive transistors for driving the data storage nodes to a low level; LD1 and LD2, load transistors for supplying charge to the data storage nodes; VBN[n], a node to which are connected the well nodes of the nMOS transistors in all nth-column memory cells; and VBP[n], a node to which are connected the well nodes of the pMOS transistors in all nth-column memory cells. For example, the potential of the power supply line Vdd is 1.2 V, and that of the ground line Vss is 0 V. The SRAM circuit of the present embodiment has a configuration suitable for memory cells that have a rectangular shape elongated in the word line direction (commonly referred to as "laterally extending cells"). In a laterally extending cell, n- and p-wells that are elongated in a direction perpendicular to the word line are alternately arranged in the word line direction. As a result, the memory cell has a rectangular shape elongated in the word line direction, as described above. Since the cell has such a shape, the nodes VBN[k] and VBP[k] extend perpendicular to the word line WL (that is, parallel to the bit line).

Figure 3:
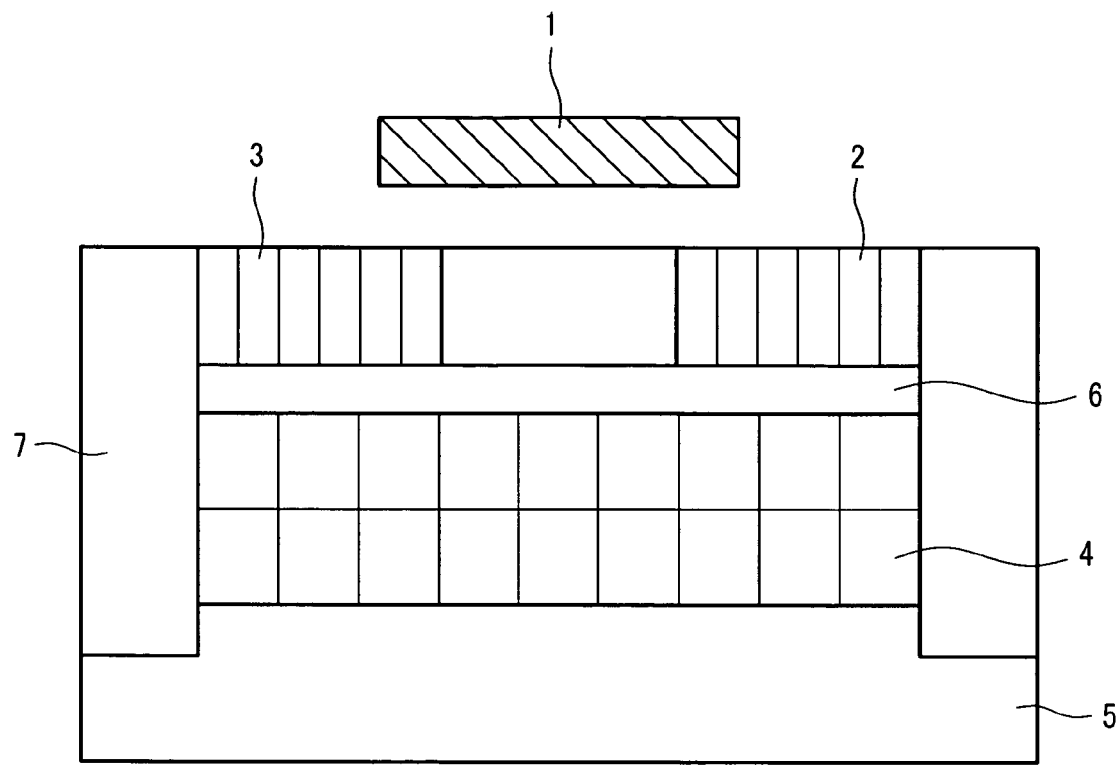
FIG. 3 is a schematic cross-sectional view of a transistor structure employed by the present invention.

FIG. 3 is a schematic cross-sectional view of a transistor used in the circuit shown in FIG. 1. This transistor is an SOI transistor in which the channel portion is insulated from the substrate portion by the BOX layer. Referring to FIG. 3, reference numeral 1 denotes a gate; 2, a drain; 3, a source; 4, a well layer under the box layer; 5, a substrate; 6, the buried oxide (BOX) layer; and 7, a trench isolation region. The transistor has a fully depleted SOI (FD-SOI) transistor structure, which allows the threshold voltage Vth of the transistor to be adjusted by changing the potential of the well layer. (In the case of a bulk CMOS transistor, its threshold voltage Vth can be adjusted in the same manner by changing the back-gate potential.) It should be noted that the thinner the BOX layer, the larger the change in the threshold voltage Vth when the potential of the well layer is changed. The present invention assumes the thickness of the buried oxide layer to be 20 nm or less (approximately 10 nm). However, the present invention can be applied to an SOI transistor having a buried oxide layer thickness of 20 nm or more to adjust the threshold voltage Vth, although the change in the threshold voltage Vth when the potential of the well layer is changed is smaller. Further, since the well layer is isolated from the diffusion layers of the transistor, such as the source and drain layers, by the BOX layer (which is an insulation layer), a current does not flow between the well layer and these diffusion layers even if the well potential is changed.

Figure 4:
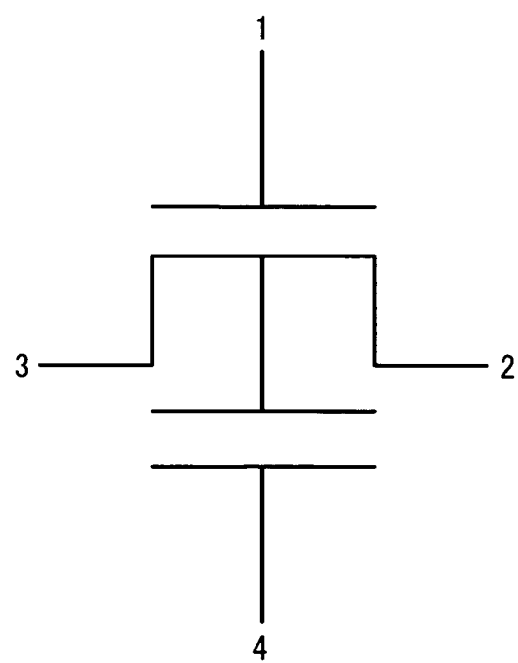
FIG. 4 is a diagram showing an equivalent circuit of a transistor employed by the present invention.

FIG. 4 shows an equivalent circuit of the transistor structure shown in FIG. 3. Referring to FIG. 4, reference numeral 1 denotes a gate; 2, a drain; 3, a source; and 4, a well. The well is isolated from the back gate of the transistor by the BOX layer, which forms a capacitance. Transistors having this structure are used in the SRAM circuit shown in FIG. 1.

Figure 2:
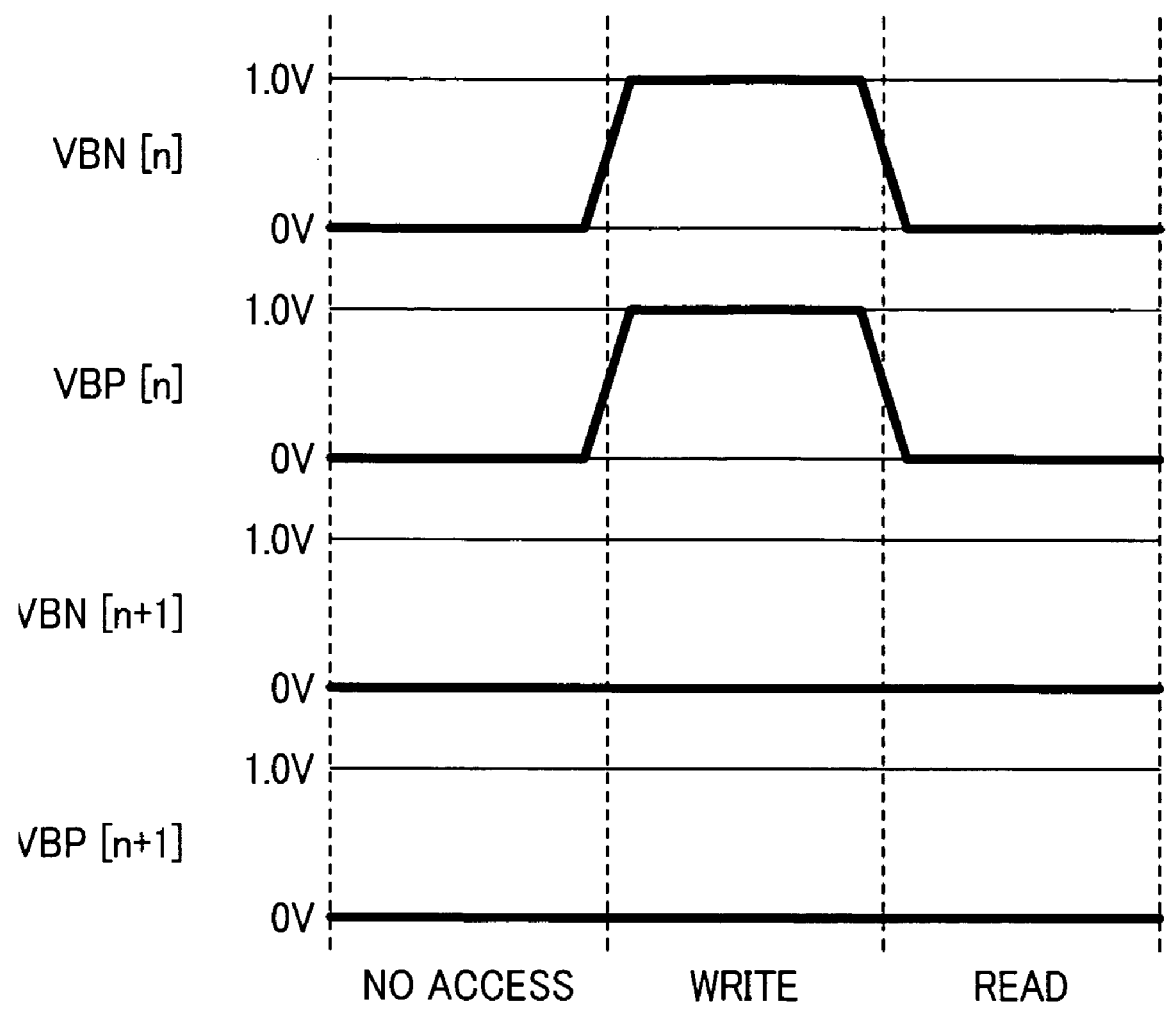
FIG. 2 is a diagram showing the voltage relationship between well nodes in SRAM according to the present invention.

FIG. 2 shows changes in the well potentials of each column. In the figure, the well nodes VBN[n] and VBP[n] are accessed and therefore their potentials are changed. The well nodes VBN[n+1] and VBP[n+1], on the other hand, are not accessed and hence their potentials are not changed. Since SRAM is usually accessed on a column basis, FIG. 3 shows the potential of each column (or each well node). If all columns (or all well nodes) are accessed at once, their potentials are the same as those of the well nodes VBN[n] and VBP[n]. When a memory cell is read or is not accessed, the well node potentials of the nMOS and pMOS transistors are both set to a low level. On the other hand, when the memory cell is programmed, the well node potentials of the nMOS and pMOS transistors are both set to a high level.

Figure 32:
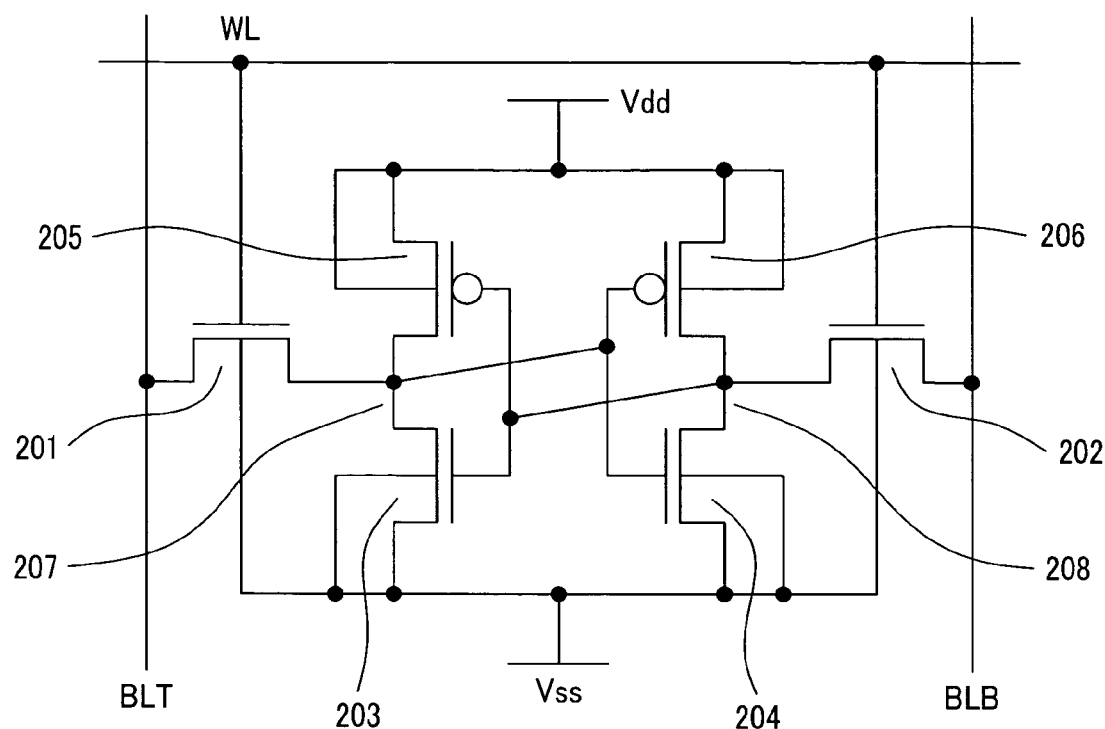
FIG. 32 is a schematic diagram showing the circuit configuration of a conventional SRAM memory cell.

A description will be made of a read operation on the memory cell shown in FIG. 32 when the storage node 207 stores a low level (or low data) and the storage node 208 stores a high level (or high data). When a read operation is performed, the bit lines BLT and BLB are precharged to a high potential. After completion of the precharge, the word line WL is set to a high potential to turn on the transfer transistors 201 and 202. As a result, the charge on the bit line BLT, which has been set to a high potential, is discharged through the transfer transistor 201, the storage node 207, and the drive transistor 203. When the potential of the bit line BLT has been reduced to a sufficiently low level (that is, when the change in the potential of the bit line BLT has become large enough to be able to be sensed by a sense amplifier), the sense amplifier (not shown) connected to the bit line is activated to amplify the change and output it, thereby delivering the data stored in the memory cell. Note the path through which the charge on the bit line (BLT) is discharged. The storage node 207 is held at a low potential level, that is, 0 V until the read operation is started. After the initiation of the read operation, the potential of the storage node 207 increases to a positive level (e.g., 0.3 V), since the voltage between the bit line BLT and the ground line Vss is resistively divided by the transfer transistor 201 and the drive transistor 203. Since the potential of the storage node 207 has become high, the conductance of the nMOS transistor whose gate is connected to the storage node 207 increases and the conductance of the pMOS transistor whose gate is connected to the storage node 207 decreases. As a result, the potential of the storage node 208, which has been held at a high level, decreases. The reduction in the potential of the storage node 208 is fed back to the storage node 207, which leads to an increase in the potential of the storage node 207. This may be repeated and, as a result, the data stored in the memory cell may be destroyed. In the case of a common memory cell, since the ratio of the conductance of the drive transistor to that of the transfer transistor is set to as high as about 1.5, the potential of the storage node 207 does not become high enough to destroy the data stored in the memory cell.

However, with the recent trends toward the miniaturization of transistors, transistors produced by a manufacturing process have tended to vary in performance more widely. Even memory cells having a conductance ratio lower than the design value have been produced, resulting in reduced stability of read and write operations. Further, reducing the power supply voltage of the memory cell to reduce the power consumption results in a reduction in the logic threshold voltage of the inverter made up of the nMOS and pMOS transistors whose gates are connected to the storage node 207, increasing the likelihood that a feedback event destroying data may occur. This also leads to a degradation in the stability of read operation.

There will now be described a read operation on the memory cell shown in FIG. 1 when the storage node NT stores a low level and the storage node NB stores a high level. (This operation is substantially the same as that described in connection with the memory cell shown in FIG. 32.) Referring to FIG. 1, since the well potentials of the load transistors LD1 and LD2 are at a low level, they have low threshold voltages Vth and hence high conductance (corresponding to driving power), as compared to conventional arrangements. Since the well potential of the drive transistor DR2 is approximately the same as the source potential, the logic threshold voltage of the inverter made up of the load transistor LD2 and the drive transistor DR2 is high, as compared to the case where the well potential of the load transistor LD2 is high. Therefore, in this memory cell, a feedback event destroying data is unlikely to occur even when the potential of the storage node NT increases.

Thus, when the well potential of the load transistors is low, the stability of read operation and hence margins for reliable read operations are high. Therefore, this memory cell tolerates variations and is suitable for operation at a reduced voltage. Further, according to the present invention, even when a low potential is applied to the wells of the pMOS transistors, a voltage high enough to turn on the PN junction (that is, 0.5 V or more) can be applied without increasing the power consumption since the insulation layer prevents a current from flowing from the wells to the diffusion layers.

There will now be described a write, or programming, operation on the memory cell shown in FIG. 32 when the storage node 207 stores a high level and the storage node 208 stores a low level. (This operation is to program the memory cell such that it stores the opposite data, that is, the storage node 207 stores a low level and the storage node 208 stores a high level.) Referring to FIG. 32, the bit line BLT is set to a low level, the bit line BLB is set to a high level, and the word line is set to a logic high ("H") level to turn on the transfer transistors. As a result, the charge on the storage node 207 is discharged through the transfer transistor 201, and hence the potential of the storage node 207 decreases from the high level. When the potential of the storage node 207 has become lower than the logic threshold voltage of the inverter made up of the load transistor 206 and the drive transistor 204, the potential of the storage node 208 increases from a low level and a feedback event between the two storage nodes occurs, with the result that new data is written to the memory cell.

Thus, an SRAM memory cell is programmed by discharging the charge on the storage node at a high level through a transfer transistor. However, to complete the programming operation, the transfer transistor must draw more charge than delivered by the load transistor since these operations are performed at the same time. This means that the higher the conductance of the load transistor, the longer the time required to complete the programming operation. Further, if the conductance of the load transistor exceeds the design value due to process variations, etc., the memory cell may not be able to be programmed. To prevent this from happening, it is necessary to reduce the conductance of the load transistor or increase the conductance of the transfer transistor.

New data is written to the memory cell of the present embodiment in the same manner as to a conventional memory cell. In the circuit shown in FIG. 1, for example, the well potentials of the load transistors LD1 and LD2 of each memory cell in the column to be programmed are set to a high level to increase the threshold voltages Vth of these load transistors and thereby reduce their driving power (or reduce their conductance), as compared to when the memory cell is not accessed or is read. At the same time, the well potentials of the nMOS transistors in the memory cell are set to a high level to reduce their threshold voltages Vth and thereby increase their driving power (or increase their conductance). As a result, the write operation is quickly completed, since the driving power, or current, of the transfer transistors (which function to reduce the potential of the storage node at a high level) is high and that of the load transistors (which function to maintain the potential of the storage node at the high level) is low. That is, the memory cell of the present embodiment provides increased margins for reliable write operations. Therefore, this memory cell tolerates variations and is suitable for operation at a reduced voltage. Further, according to the present invention, even when a high potential is applied to the wells of the nMOS transistors, a voltage high enough to turn on the PN junction (that is, 0.5 V or more) can be applied without increasing the power consumption since the insulation layer prevents a current from flowing from the wells to the diffusion layers.

As described above, the well potentials of the transistors making up a memory cell may be appropriately adjusted in read and write operations to increase operating margins for these operations. This allows the memory cell to be resistant to process variations and suitable for operation at a reduced voltage.

Figure 5:
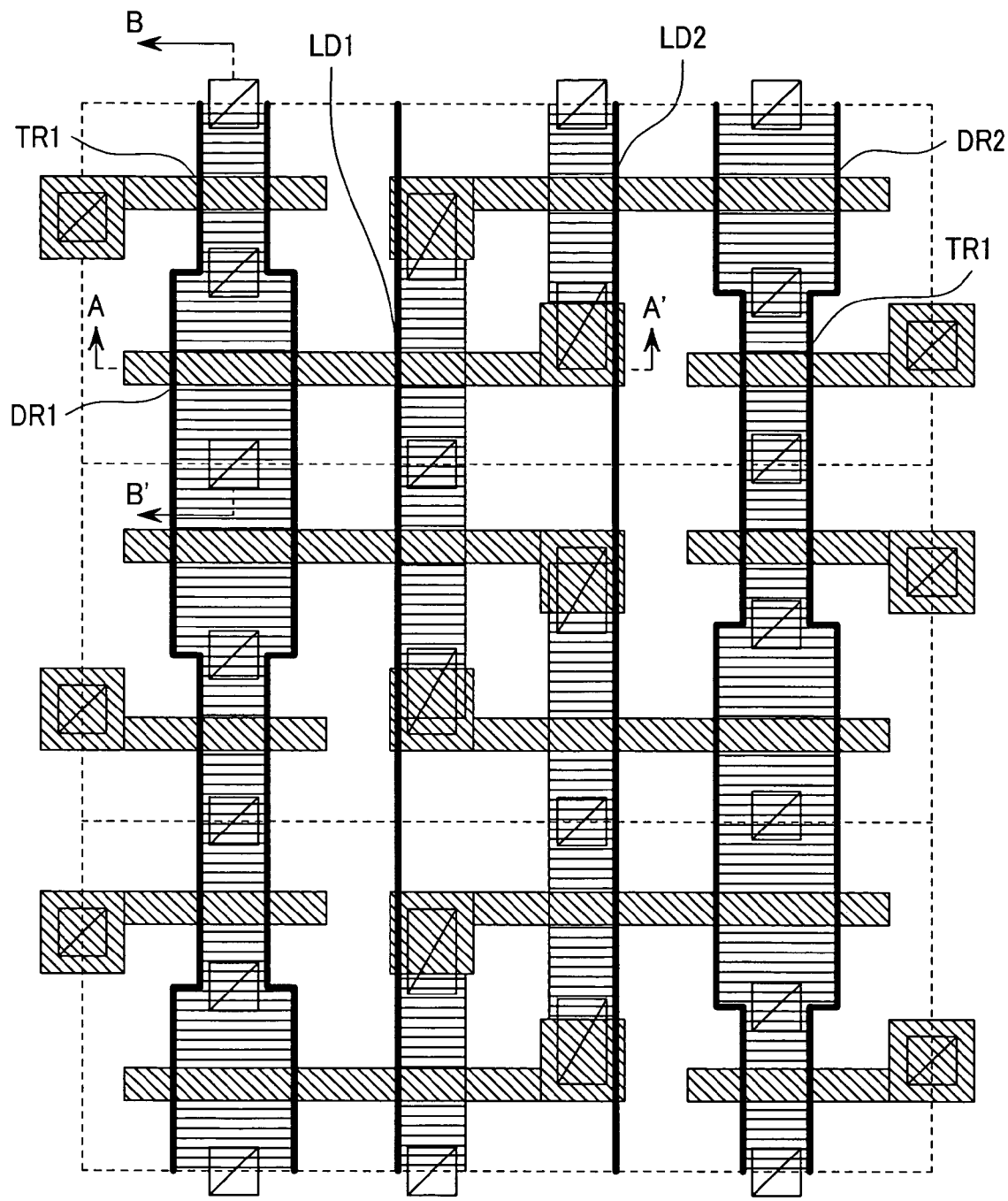
FIG. 5 is a schematic diagram showing an SRAM memory cell layout according to the present invention.

FIG. 5 is a diagram showing a layout of memory cells such as that described above. Referring to the figure, symbols TR1 and TR2 denote transfer transistors; DR1 and DR2, drive transistors; LD1 and LD2, load transistors; Gate, polysilicon layers constituting transistor gate electrodes; Diffusion, diffusion layers; Contact, contacts for connecting between metal wiring and diffusion and polysilicon layers; and Well, the well layers of transistors. Each memory cell area is designated and enclosed by a broken line box. FIG. 5 shows three memory cells arranged in the same column. The well layers of the nMOS transistors of these memory cells are coupled to one another and hence are at the same potential. Likewise, the well layers of their pMOS transistors are coupled to one another and hence are at the same potential. Further, the well layers of the transistors in adjacent columns are separated from each other and set to different potentials. These memory cells have a rectangular shape elongated in the word line direction and are commonly referred to as "laterally extending cells." In a laterally extending cell, n- and p-wells that are elongated in a direction perpendicular to the word line are alternately arranged in the word line direction. As a result, the memory cell has a rectangular shape elongated in the word line direction, as described above. Since the cell has such a shape, the nodes VBN[k] and VBP[k] extend perpendicular to the word line WL (that is, extend parallel to the bit line), as shown in FIG. 1.

Figure 6:
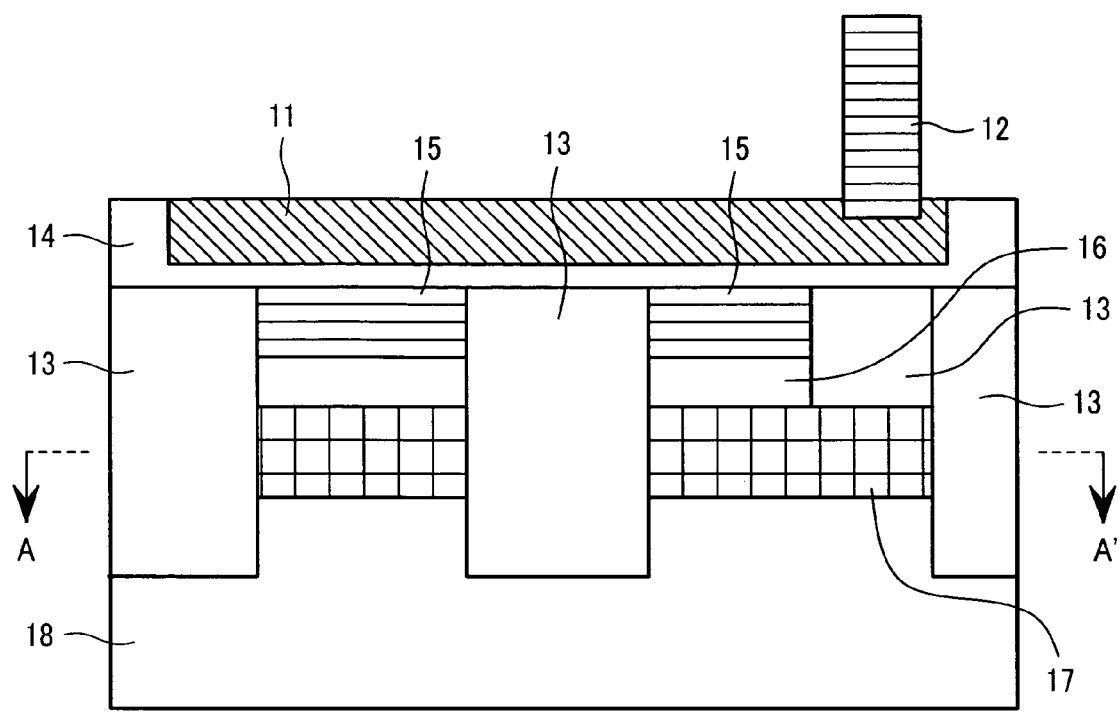
FIG. 6 is a cross-sectional view of an SRAM memory cell according to the present invention.

FIG. 6 is a cross-sectional view taken along line A-A' of FIG. 5. Referring to FIG. 6, reference numeral 11 denotes a gate electrode; 12, a contact; 13, trench isolation layers; 14, a gate insulation layer; 15, an SOI layer; 16, a BOX layer; 17, well layers; and 18, a substrate. The SOI layer in which the channel is formed is isolated from the well layers by the BOX layer. This prevents a current from flowing from the wells to the source electrode even when a bias is applied to the well layers in the forward direction of the bulk CMOS transistor. Further, the SOI layer and the well layers are isolated by the trench isolation layers from the transistors adjacent to them.

Figure 7:
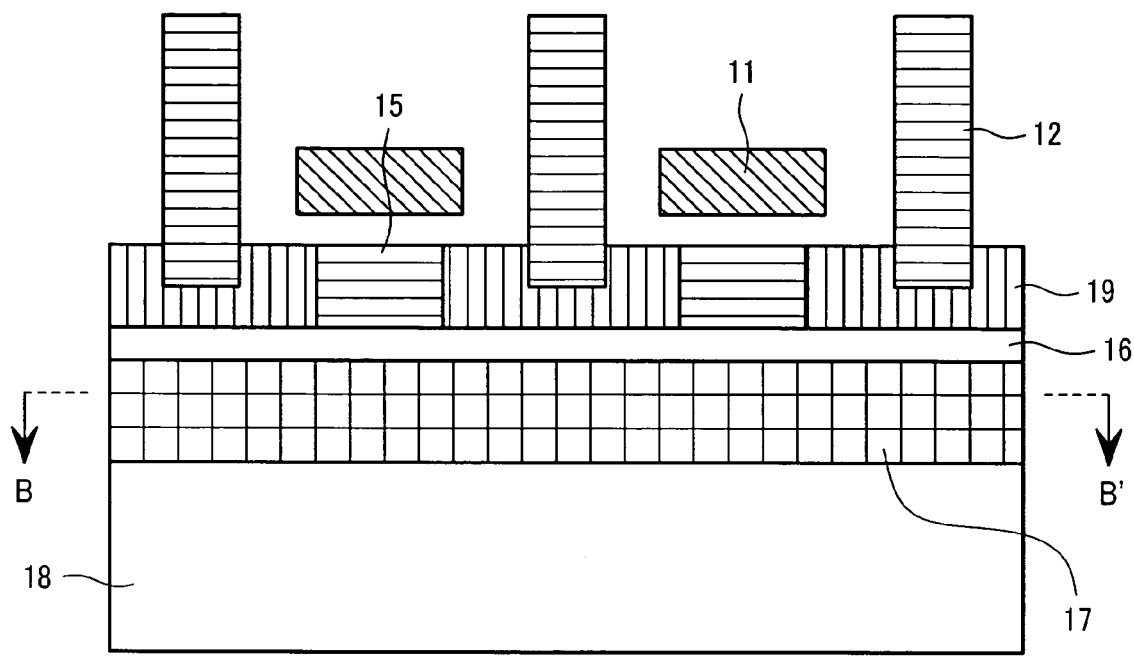
FIG. 7 is another cross-sectional view of the SRAM memory cell according to the present invention.

FIG. 7 is a cross-sectional view taken along line B-B' of FIG. 5. Referring to FIG. 7, reference numeral 11 denotes gate electrodes; 12, contacts; 15, SOI layers; 16, a BOX layer; 17, a well layer; 18, a substrate; and 19, diffusion layers. As can be seen from the figure, the wells of the transistors arranged in the same column are coupled to each other and hence are at the same potential.

Figure 8:
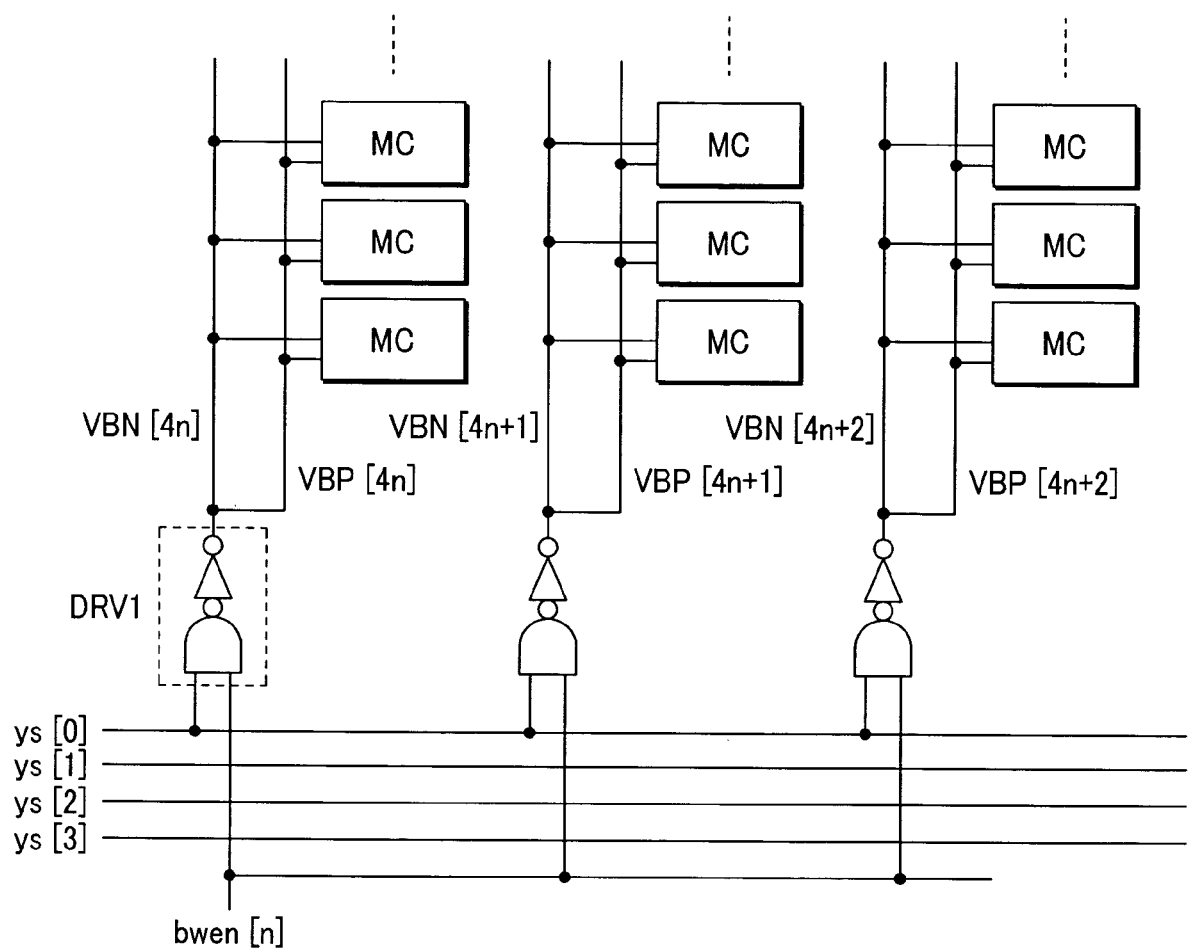
FIG. 8 is a schematic diagram showing a circuit for controlling well nodes of SRAM according to the present invention.

FIG. 8 is a diagram showing a circuit for controlling the well potentials as shown in FIG. 2. Referring to the figure, symbols VBN[4n] to VBN[4n+2] denote the well electrodes of nMOS transistors in the (4n)th to (4n+2)th columns, respectively; VBP[4n] to VBP[4n+2], the well electrodes of pMOS transistors in the (4n)th to (4n+2)th columns, respectively; DRV1, a drive circuit for driving well electrodes to a potential level; ys[0] to ys[3], column selection signals for selecting a column; and bwen[n], a write signal for indicating a write, or programming, operation. A write operation to a column is performed as indicated by these selection signals and write signal. Specifically, in the circuit shown in FIG. 8, the logical AND of a column selection signal and the write signal is input to a respective well node. When a write operation is performed on a memory cell, the well potentials of the nMOS and pMOS transistors are set to a high level; and when a write operation is not performed, the well potentials are set to a low level, as shown in FIG. 2.

Figure 9:
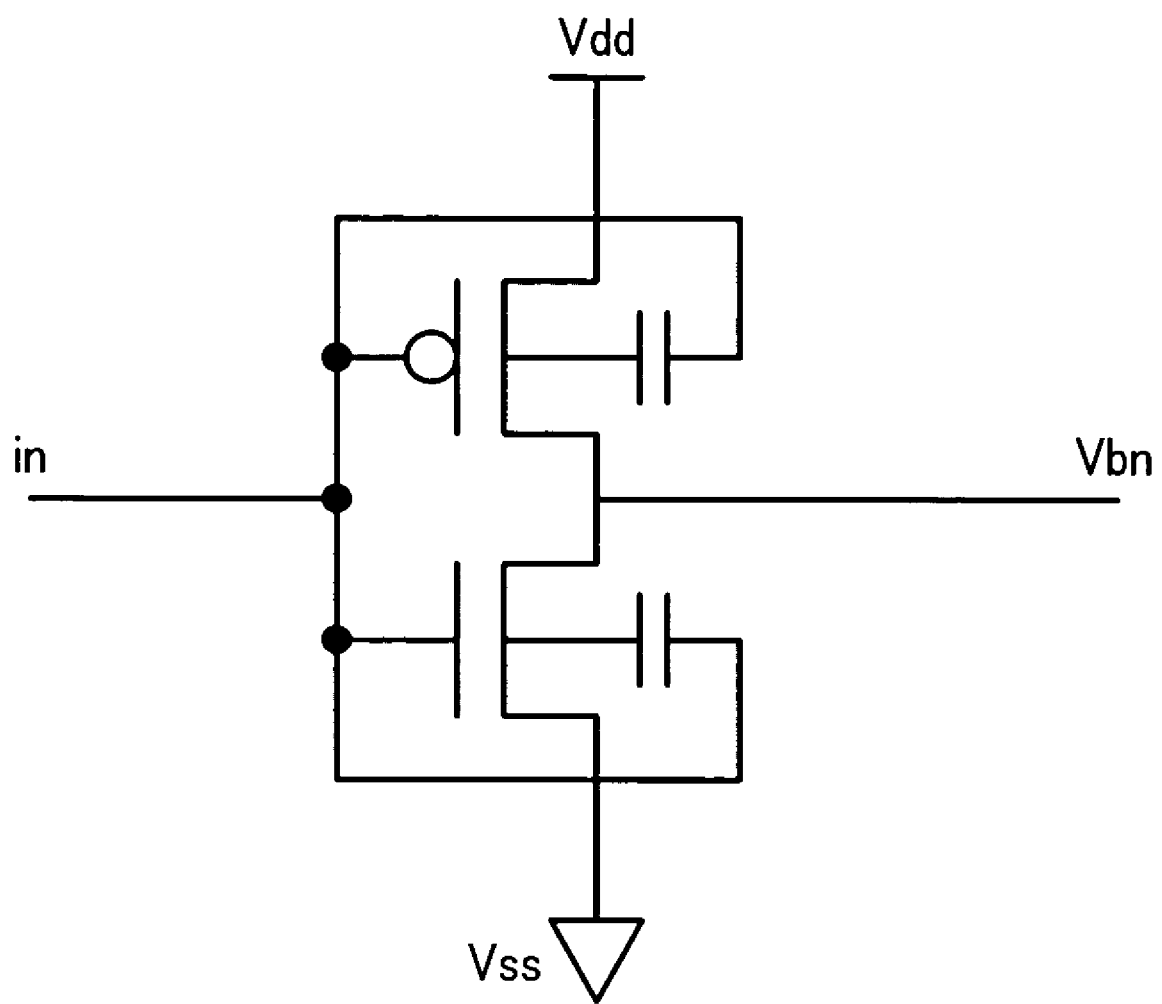
FIG. 9 is a schematic diagram showing a control circuit for SRAM according to the present invention.

FIG. 9 shows an exemplary final stage inverter circuit in the well node driving circuit DRV1. Referring to the figure, symbols Vdd and Vss denote power supply nodes; in, an input signal; and Vbn, the output of the inverter circuit. When this column is not programmed, the input signal in is set to a high level; and when it is programmed, the input signal in is set to a low level. Therefore, when this column is programmed, the output Vbn assumes a high level, thereby improving the programming characteristics. Specifically, in the circuit shown in FIG. 9, since the well node of the pMOS transistor is connected to its gate, when the potential in is changed from a high level to a low level, the well node potential of the PMOS transistor is changed to a low level. As a result, the threshold voltage Vth of the pMOS transistor decreases and hence its driving power increases, making it possible to quickly drive the well node of the memory cell column to a high potential level.

Further, the well node of the NMOS transistor is also connected to its gate, allowing the well potential of the memory cell column to be quickly changed to a low level. If the operating speed is not important, each well may be connected to a respective source. (That is, their potentials may be set equal to each other.) Where the subthreshold leakage current is not a problem, the well of the nMOS transistor may be connected to the node Vdd and the well of the pMOS transistor may be connected to the node Vss in order to reduce the threshold voltages Vth of these transistors and thereby increase their operating speed. Further, if it is only necessary to increase the speed at which the potentials of the well nodes in the memory cell are increased to a high level and hence it is not necessary to increase the speed at which these well node potentials are reduced to a low level, only the well node of the pMOS transistor may be connected to the gate electrode or the node Vss to increase the speed.

Figure 10:
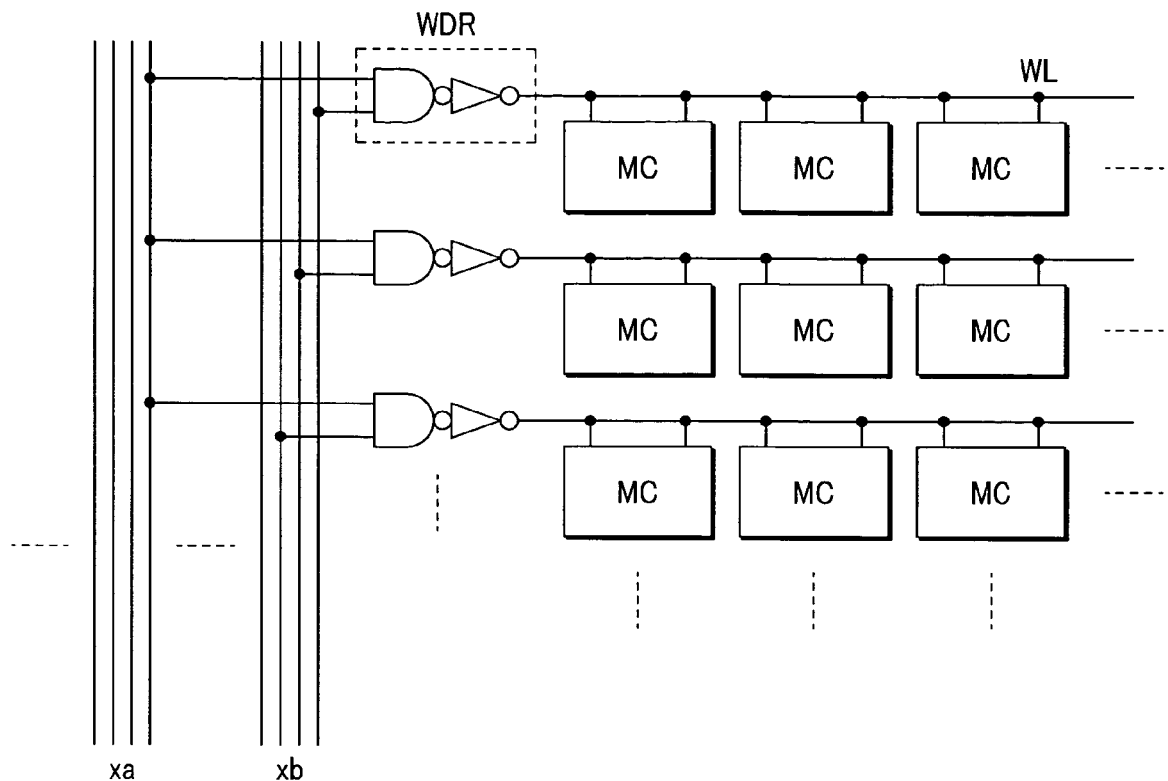
FIG. 10 is a schematic diagram showing word line drivers of SRAM according to the present invention.

FIG. 10 shows an exemplary circuit for controlling the word lines of the SRAM circuit. Referring to the figure, symbol MC denotes memory cells; WL, word lines; WDR, word line drivers; and xa and xb, address decoded signals. In this circuit configuration, a word line specified by the address signals xa and xb is driven to a high level by the word driver circuit to access memory cells.

Figure 11:
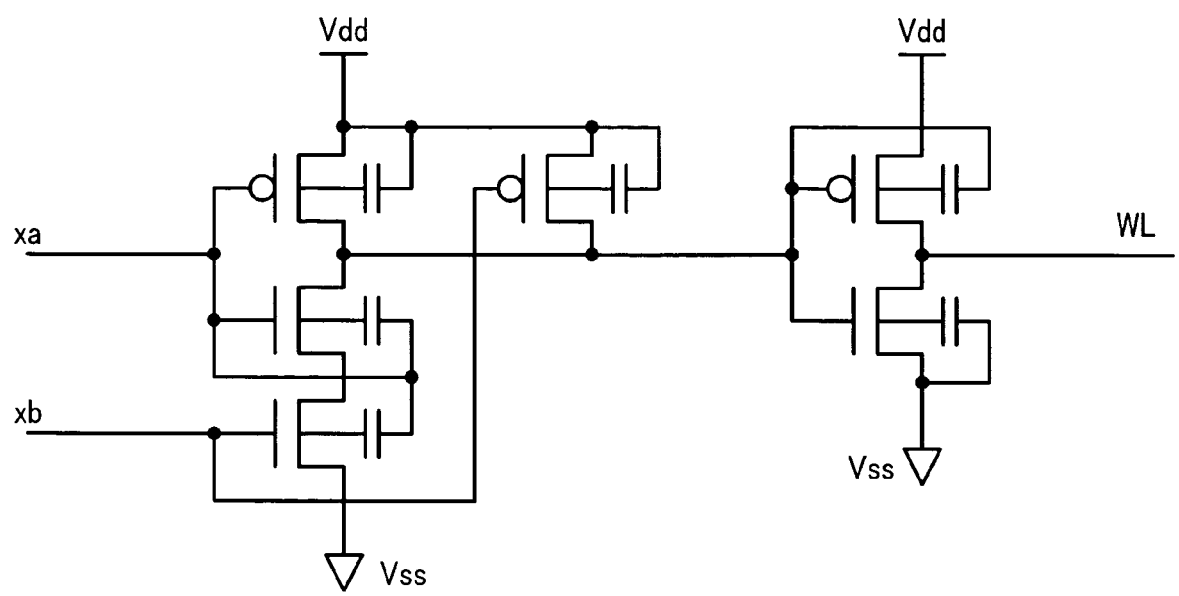
FIG. 11 is a schematic diagram showing a word line driver of SRAM according to the present invention.

FIG. 11 shows an exemplary word line driver circuit used in the circuit shown in FIG. 10. This driver circuit includes: an NAND circuit to which the address signals xa and xb are input; and an inverter circuit for outputting an inversion of the output of the NAND circuit as a word line potential. That is, when the address signals xa and xb are both at a high level, the word line potential is at a high level. Generally, the operating speed of a memory cell is greatly affected by the signal rise time on the word line. Therefore, the speed at which the potential of the word line is changed from a low level to a high level may be increased to increase the operating speed of the memory cell. In this driver circuit, the well nodes of the nMOS transistors within the NAND circuit and the pMOS transistor within the inverter circuit are connected to their respective gate electrodes. As a result, the threshold voltages Vth of these transistors are reduced when they are turned on, resulting in an increase in their driving power and hence in their operating speed. When the word line potential is increased from a low level to a high level, both nMOS transistors within the NAND circuit and the pMOS transistor within the inverter circuit are turned on, which means that connecting between the well nodes and gate nodes of these transistors increases the speed at which the word line potential changes and thereby contributes to increasing the speed of the entire memory. On the other hand, where increasing the operating speed is not an issue, each well may be connected to a respective source. (That is, their potentials may be set equal to each other.) Further, if the subthreshold leakage current is not a problem, the wells of the nMOS transistors may be connected to the node Vdd and the well of the pMOS transistor may be connected to the node Vss in order to maintain the threshold voltages Vth of these transistors at a low level and thereby increase their operating speed.

Figure 12:
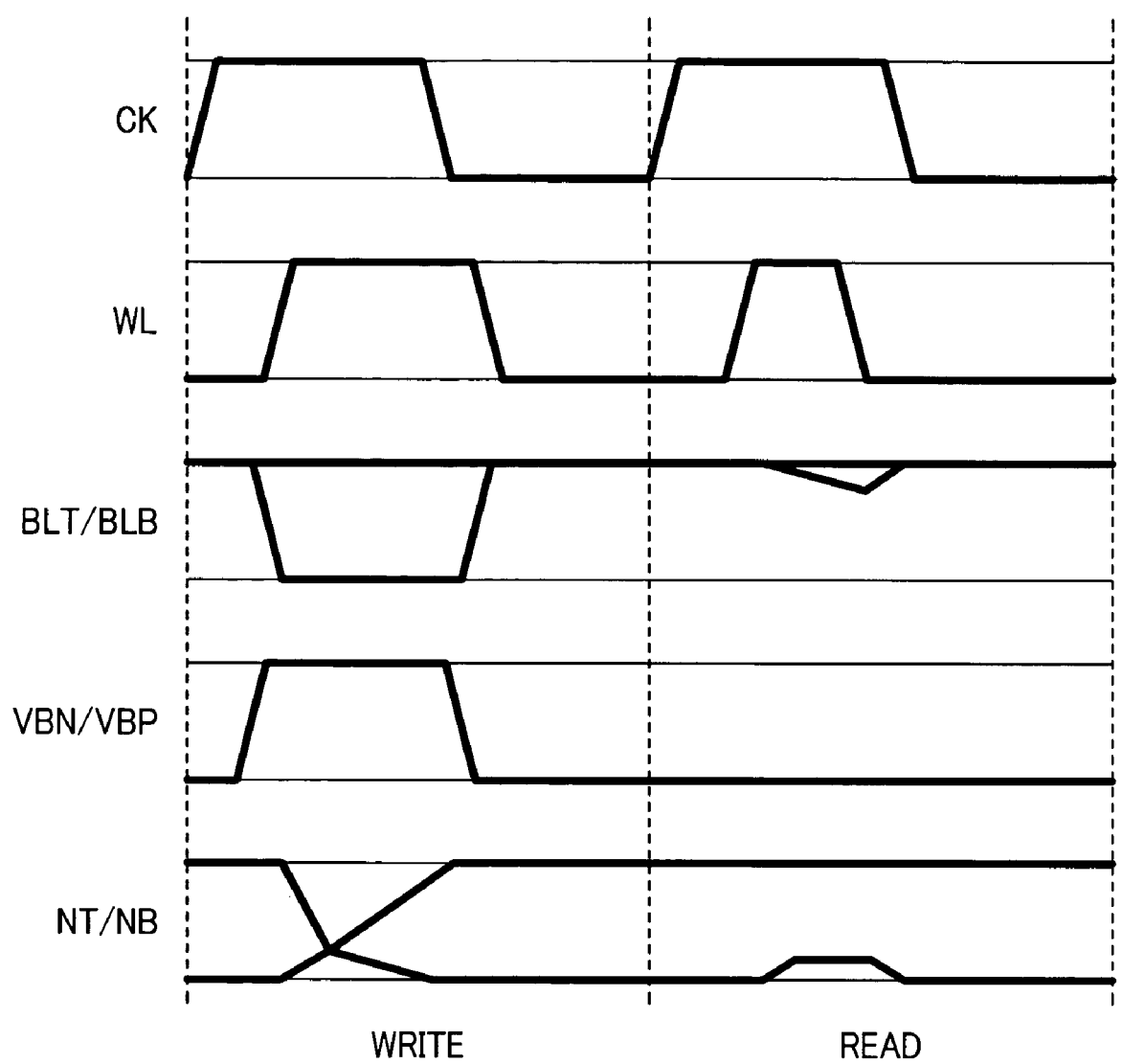
FIG. 12 is a diagram showing changes in the potential of each node in SRAM according to the present invention.

FIG. 12 shows changes in the operating voltage of each portion (or node) of the circuit of the present embodiment. In the figure, symbol CK denotes a clock signal; WL, a word line; BLT and BLB, bit lines; VBN and VBP, the well nodes of the transistors within an accessed memory cell; and NT and NB, the data storage nodes within the memory cell. Symbols Write and Read indicate a write (or programming) operation and a read operation, respectively. When the memory cell is programmed, data to be written to the cell is input to the bit line when the clock signal rises. Further, substantially at the same time, the potentials of the wells are adjusted to optimum levels for a write operation. Then, the word line potential rises from a low level to a high level and hence the storage node potentials within the memory cell are inverted, causing new data to be written to the cell. When the data in the memory cell is read, the word line potential is increased to a high level when the clock signal rises. This causes the data in a data storage node to be output to a bit line, performing a read operation.

Figure 33:
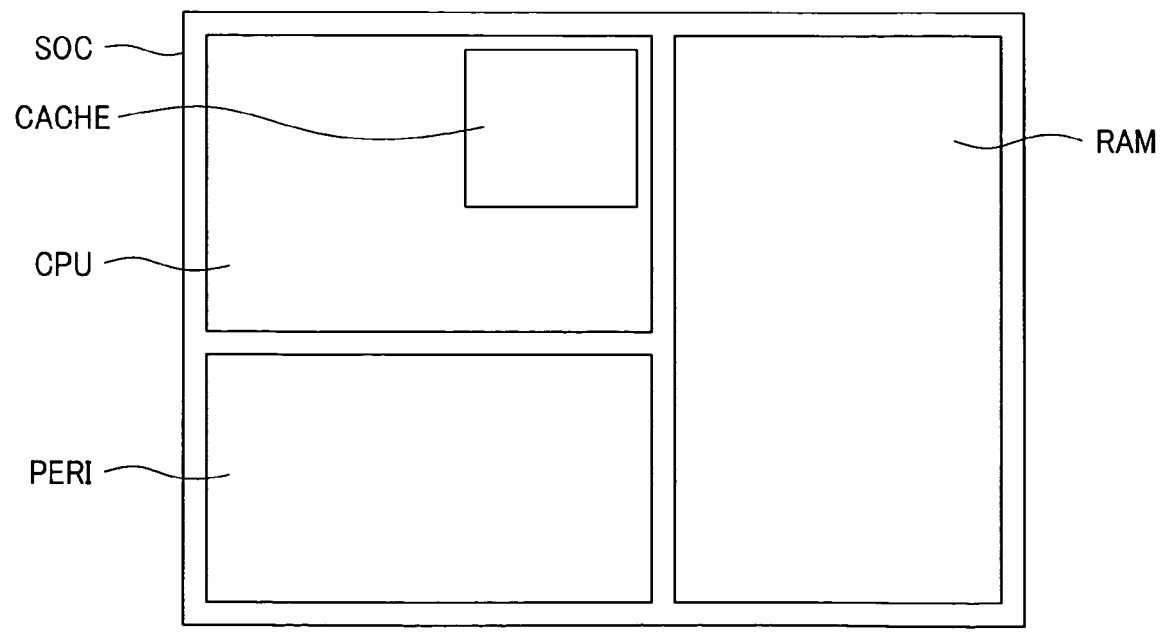
FIG. 33 is a schematic diagram showing a system LSI that includes SRAM of the present invention.

FIG. 33 shows an example of an SoC (System-on-a Chip) using SRAM of the present invention. The SoC includes: a CPU (or CPU core); a circuit block PERI having specific functions; and memory RAM having a relatively large capacity accessed by various circuits. The CPU core includes cache memory CACHE. The SRAM of the present invention may be used as the large capacity memory or the cache memory in the SoC.

Second Embodiment

Figure 13:
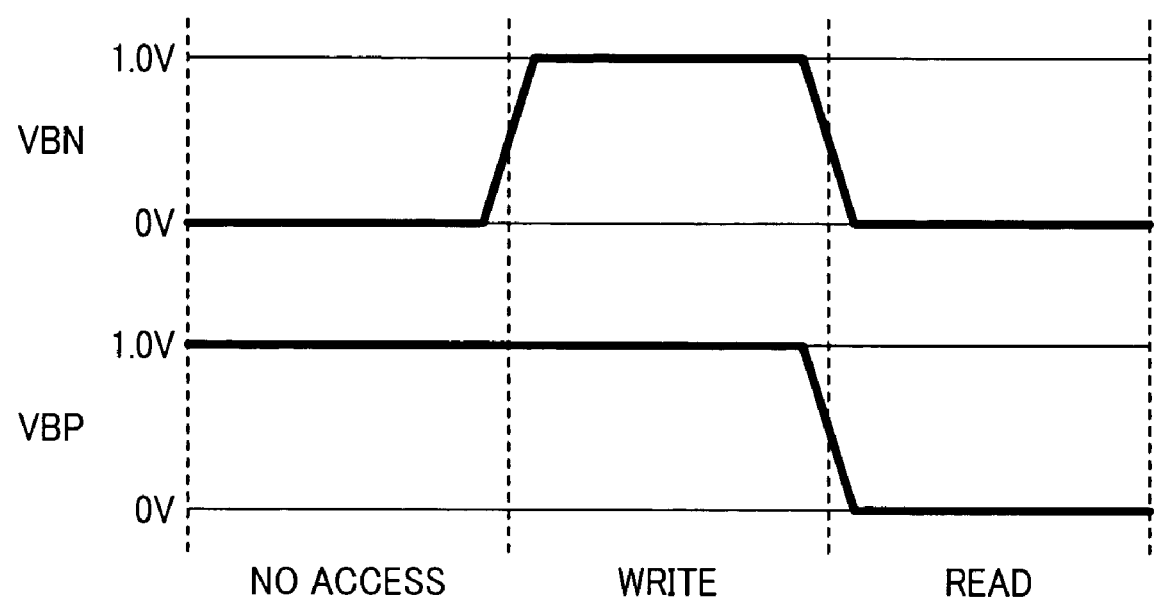
FIG. 13 is a diagram showing the voltage relationship between well nodes in SRAM according to the present invention.

FIG. 13 shows an example of how to control well potentials of an SRAM memory cell according to a second embodiment of the present invention. It should be noted that in the following description of preferred embodiments, components identical to those of the first embodiment will be denoted by like numerals and only other components will be described. The circuit configuration of this memory cell is the same as that shown in FIG. 1 in terms of transistor arrangement. FIG. 13 is different from FIG. 2 in that in the "No access" state (in which the memory cell is not accessed), the well potential of the pMOS transistors is set to a high level. In the "No access" state, especially in the stand-by state in which the memory cell stores data but is not accessed, the leakage current of the memory cell may cause a problem. In this state, if the well potential of the pMOS transistors is set to a low level, a large leakage current flows since the threshold voltages Vth of the pMOS transistors are reduced. The arrangement shown in FIG. 13 maintains the leakage current at a low level, since the well potential of the pMOS transistors is at a high level and hence their threshold voltages Vth are not reduced.

Third Embodiment

Figure 14:
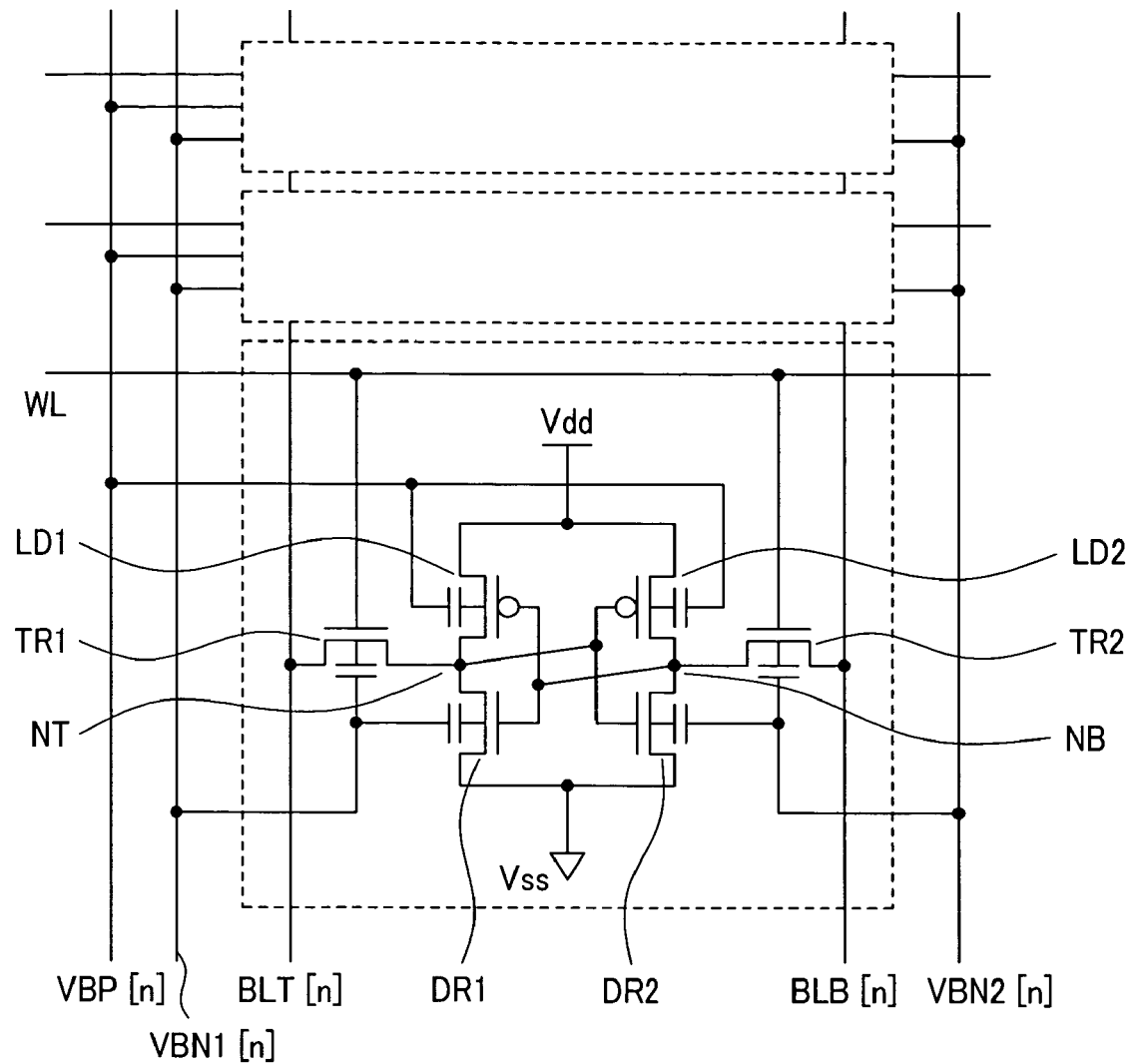
FIG. 14 is a schematic diagram showing the circuit configuration of an SRAM memory cell according to the present invention.

FIG. 14 shows a circuit diagram of an SRAM circuit according to a third embodiment of the present invention. The memory cell of the present embodiment is different from that of the first embodiment in that it includes two n-well nodes VBN1 and VBN2, instead of only one n-well node (i.e., the node VBN). The node VBN1 is connected to the wells of the nMOS transistors (on the left side) that are connected in series between the bit line BLT and the node Vss; and the node VBN2 is connected to the wells the nMOS transistors (on the right side) that are connected in series between the bit line BLB and the node Vss. The layout of the memory cell is the same as that shown in FIG. 5. (The layout of the memory cell need not be changed, since in the arrangement shown in FIG. 5, the well nodes of the nMOS transistors on the right and left sides are already connected separately.)

Figure 15:
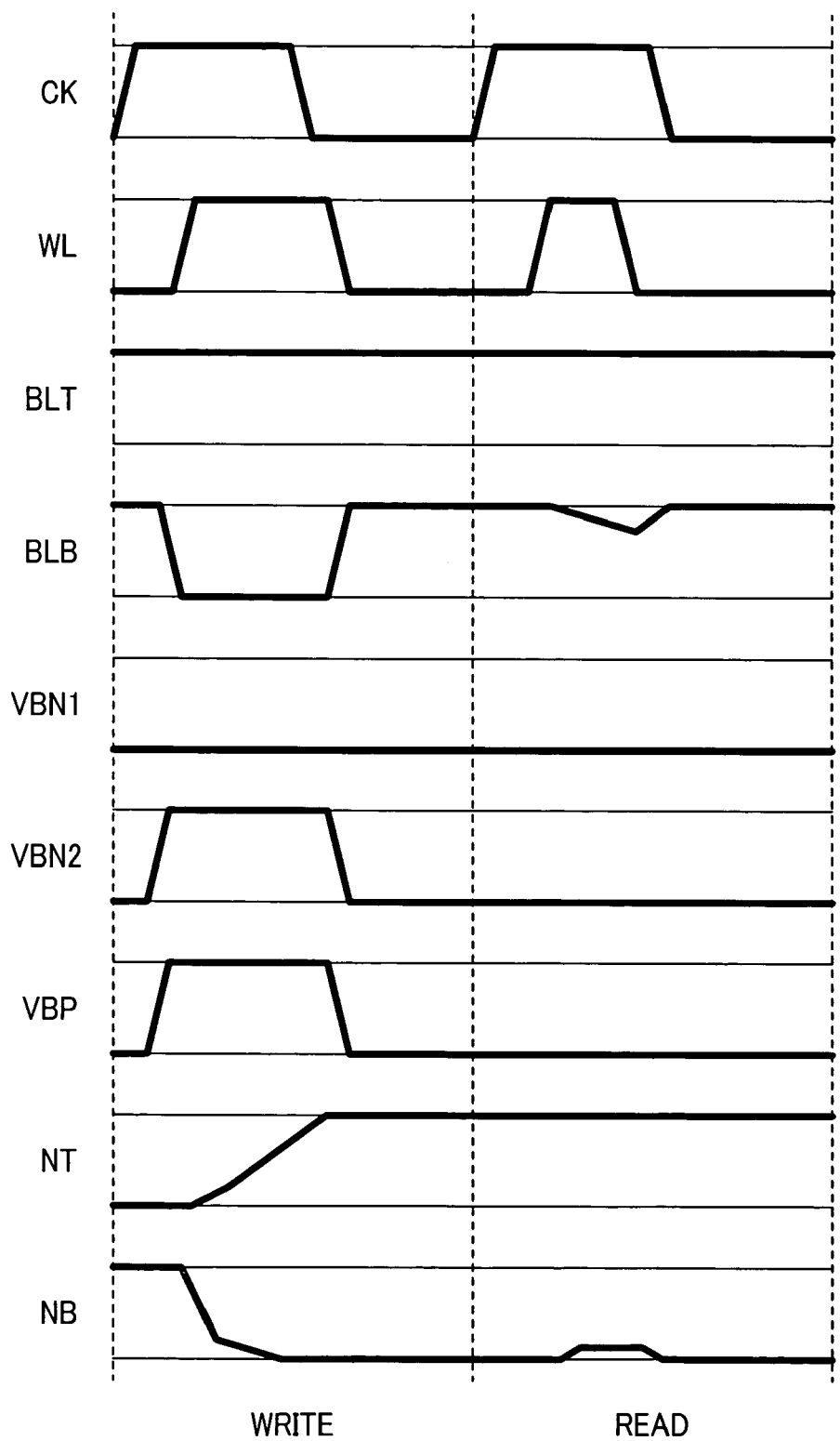
FIG. 15 is a diagram showing changes in the potential of each node in SRAM according to the present invention.

FIG. 15 shows the (voltage) waveform of each portion (or node) of the circuit of the present embodiment. The present embodiment is different from the first embodiment in that the nodes VBN1 and VBN2 are additionally provided and their potentials are adjusted to different levels when the memory cell is programmed. In FIG. 15, the potential of the node VBN1 is set to a low level and the potential of the node VBN2 is adjusted to a high level when data is written to the memory cell. This is because the bit line BLT is at a high potential level and the bit line BLB is at a low level. In such a case, the potential of the node VBN1 is adjusted to a low level and that of the node VBN2 is adjusted to a high level, as shown in FIG. 15. There will now be described an operation to write data to the SRAM memory cell. As described in connection with the first embodiment, writing (new) data to an SRAM memory cell is achieved by supplying a current through a transfer transistor and thereby reducing the potential of the storage node currently storing a high level (or high data) to a low level. When the bit line BLB is set to a low level, the programming characteristics can be improved by supplying a large current through the transfer transistor TR2. Since the well node of the transfer transistor TR2 is the node VBN2, the potential of this node may be adjusted to a high level to increase the driving power of the transistor TR2 and thereby improve the programming characteristics. It should be noted that though not shown in FIG. 15, when the node BLT is set to a glow level, the potential of the node VBN1 is adjusted to a high level to improve the programming characteristics.

Figure 16:
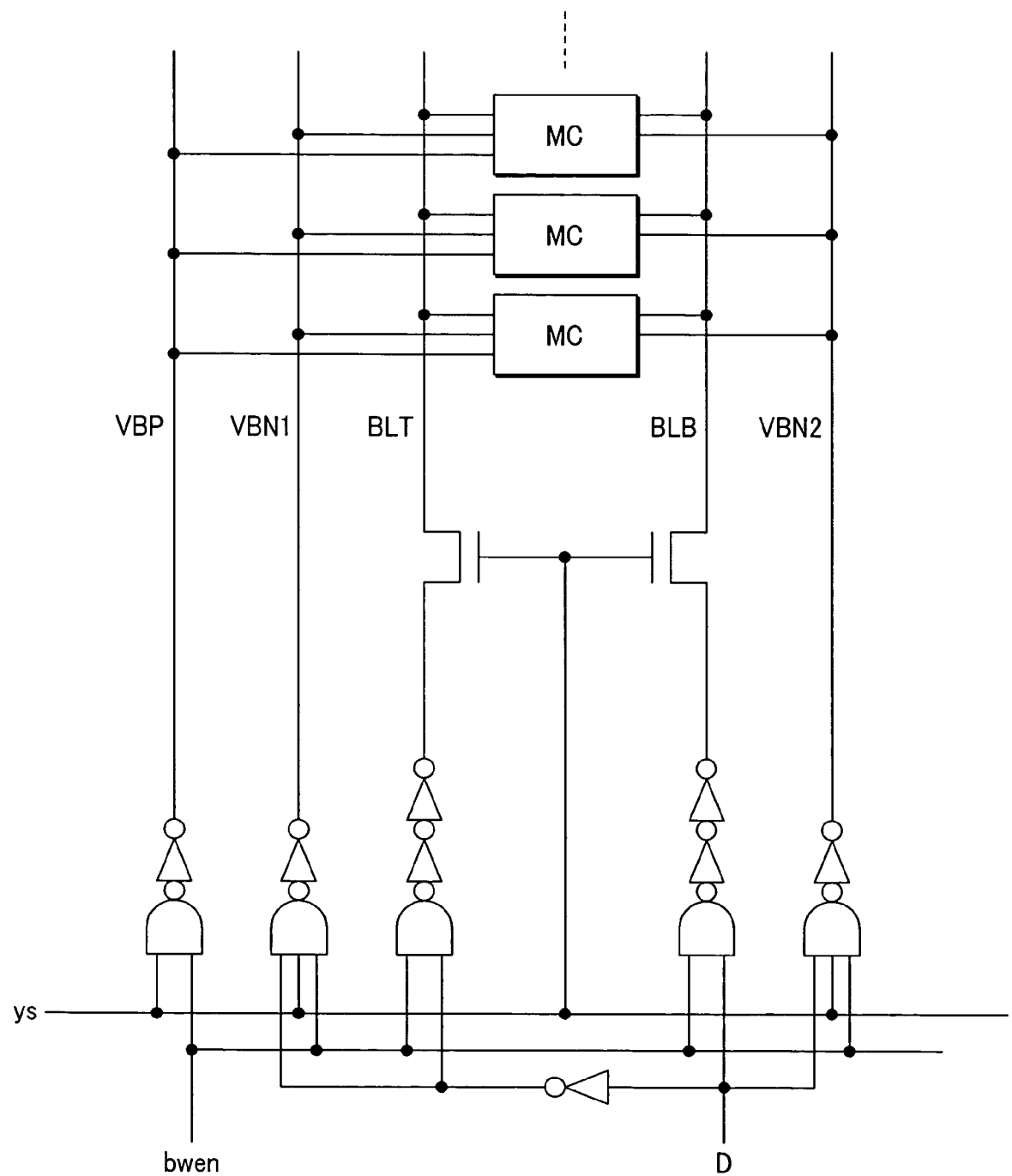
FIG. 16 is a diagram showing a circuit for controlling each node of SRAM to provide the waveforms shown in FIG. 15.

FIG. 16 is a circuit diagram showing a control circuit for achieving the waveforms shown in FIG. 15. In FIG. 16, symbol D denotes an input data signal (or write signal). As shown in the figure, the signal D is input to both bit lines BLT and BLB, and the potentials of the well nodes VBN1 and VBN2 can be adjusted to different levels. This arrangement reduces the number of wells to be controlled, resulting in a reduction in the amount of charge supplied or drawn. As a result, it is possible to reduce the power consumption without degrading the programming characteristics.

Fourth Embodiment

Figure 17:
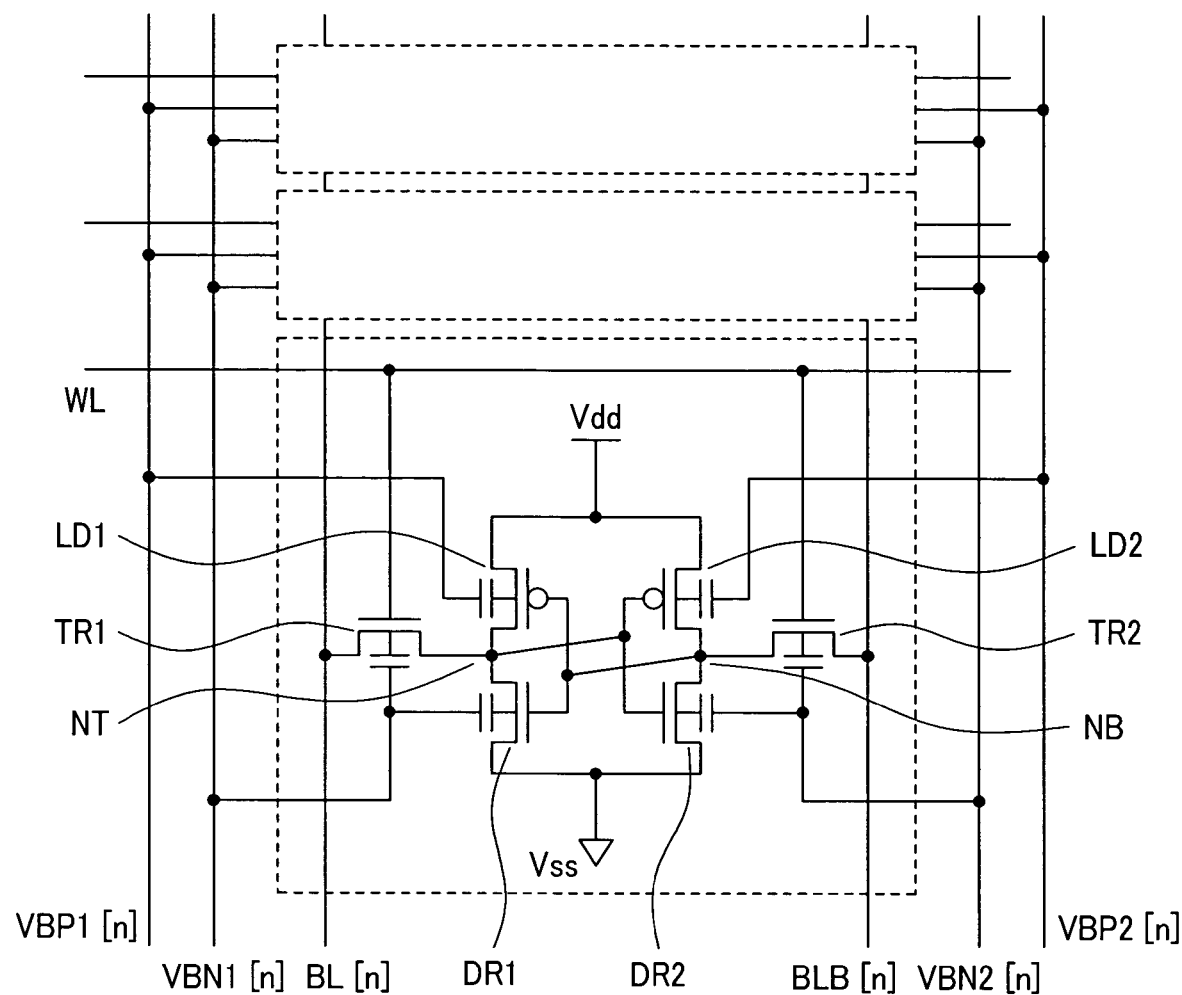
FIG. 17 is a schematic diagram showing the circuit configuration of an SRAM memory cell according to the present invention.

FIG. 17 shows a circuit diagram of an SRRM circuit according to a fourth embodiment of the present invention. The memory cell of the present embodiment is different from that of the third embodiment in that it includes two p-well nodes (on the right and left sides, respectively) in addition to the two n-well nodes, and these p-well nodes are also controlled separately.

Figure 18:
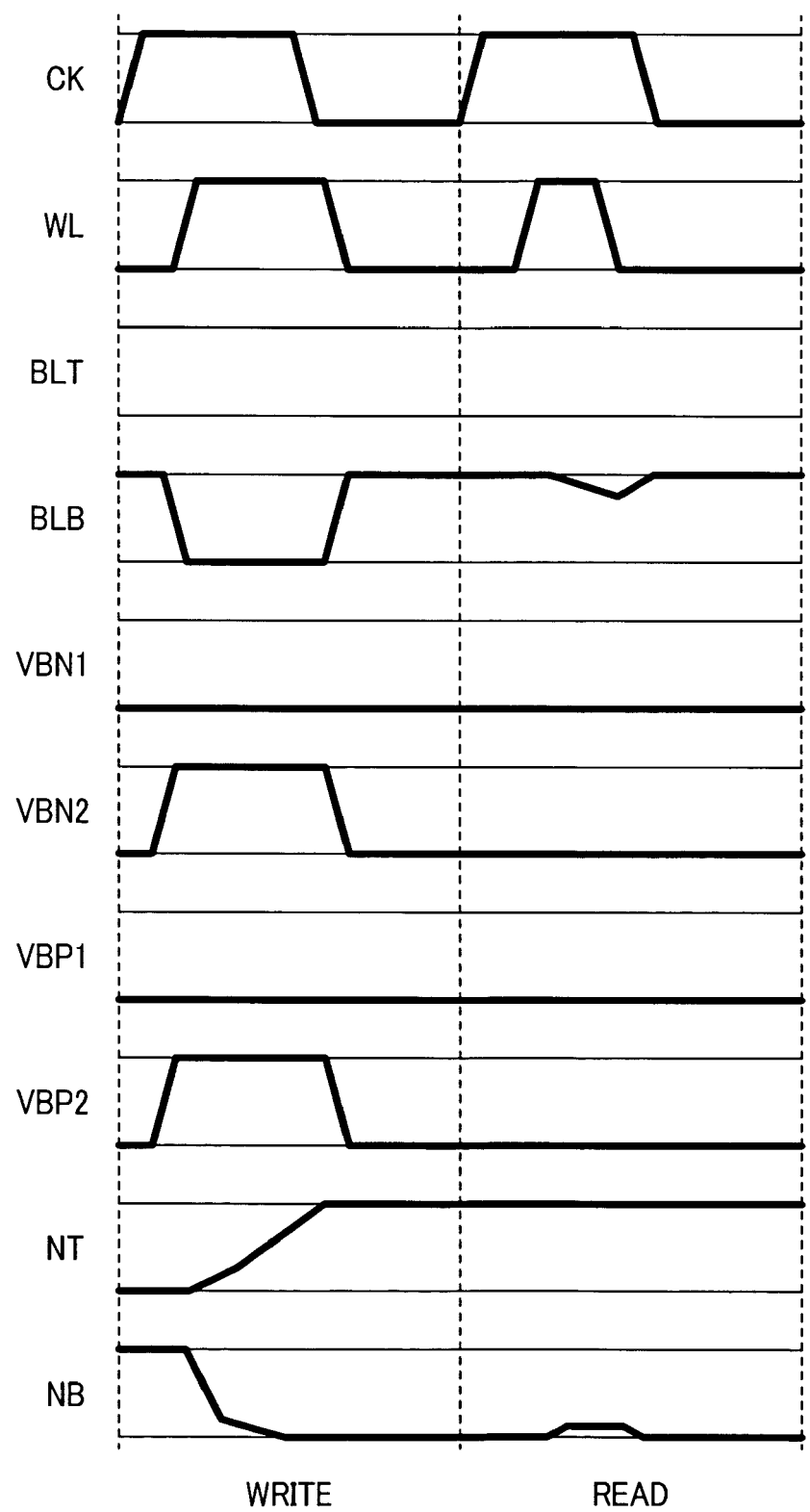
FIG. 18 is a diagram showing changes in the potential of each node in SRAM according to the present invention.

FIG. 18 shows the (voltage) waveform of each portion (or node) of the circuit of the present embodiment. Unlike the third embodiment, the potentials of the nodes VBP1 and VBP2 are adjusted to different levels, in addition to those of the nodes VBN1 and VBN2, when the memory cell is programmed. In FIG. 18, the potentials of the nodes VBN1 and VBP1 are set to a low level and the potentials of the nodes VBN2 and VBP2 are adjusted to a high level when the memory cell is programmed. This is because the bit line BLT is at a high level and the bit line BLB is at a low level. In such a case, the potentials of the nodes VBN1 and VBP1 are adjusted to a low level and those of the nodes VBN2 and VBP2 are adjusted to a high level, as shown in FIG. 18.

There will now be described an operation to write data to the SRAM memory cell. As described in connection with the first embodiment, writing (new) data to an SRAM memory cell is achieved by supplying a current through a transfer transistor and thereby reducing the potential of the storage node currently storing a high level (or high data) to a low level. When the bit line BLB is set to a low level, the potential of the storage node NB can be quickly reduced from a high level to a low level (and thereby the programming characteristics can be improved) by supplying a large current through the transfer transistor TR2 and reducing the driving power of the load transistor LD2 that is supplying charge to the storage node NB. Since the well node of the transistor TR2 is the node VBN2, the potential of this node may be adjusted to a high level to increase the driving power of the transistor TR2 and thereby improve the programming characteristics. Further, since the well node of load transistor LD2 is the node VBP2, the potential of this node may be adjusted to a high level to reduce the driving power of the transistor LD2 and thereby further improve the programming characteristics. It should be noted that though not shown in FIG. 18, when the node BLT is set to a low level, the potentials of the nodes VBN1 and VBP1 are adjusted to a high level to improve the programming characteristics.

Figure 19:
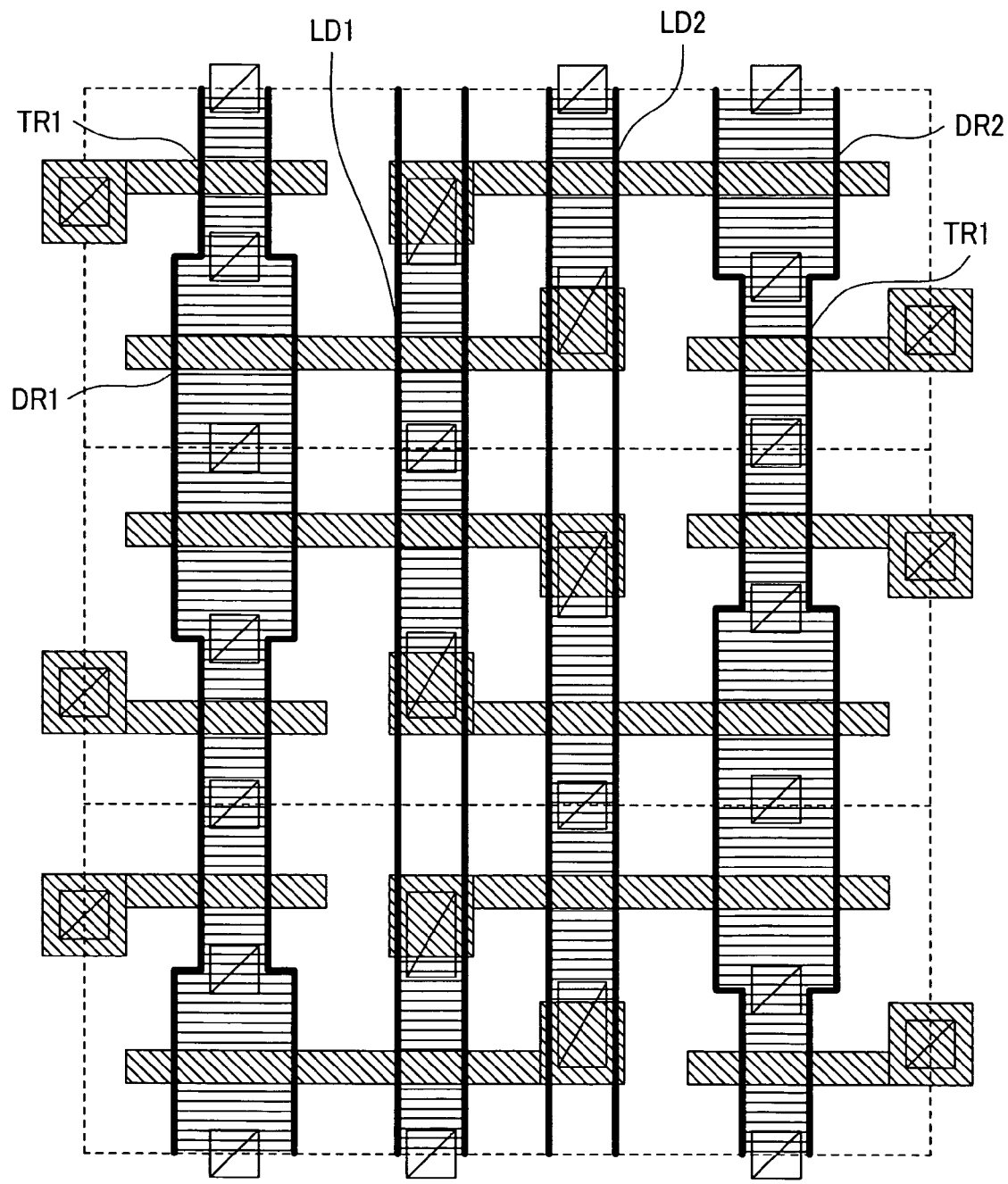
FIG. 19 is a schematic diagram showing an SRAM memory cell layout according to the present invention.

FIG. 19 shows a memory cell layout that allows for the control operation of the present embodiment. This memory cell layout is different from that of the first embodiment shown in FIG. 5 in that the well node of the load transistors is divided into two portions that are separately controlled.

This arrangement reduces the number of wells to be controlled, resulting in a reduction in the amount of charge supplied or drawn. As a result, it is possible to reduce the power consumption without degrading the programming characteristics. It should be noted that in a write operation, the potential of the storage node currently storing a high level is reduced to a low level. At that time, the other storage node currently storing a low level must be charged from a low potential level to a high potential level. This charging of the storage node to a high potential level is done by the load transistor whose drain electrode is connected to the node.

That is, when the potential of the storage node NB is reduced from a high level to a low level (as described above) in order to perform a write operation, the storage node NT must be charged from a low potential level to a high potential level. This is performed using the current of the load transistor LD1. If the well potentials of both load transistors LD1 and LD2 are adjusted to the same value (as in the first embodiment, etc.), it takes time to charge the storage node NT to a high potential level since the driving power of the transistor LD1 is reduced. This may result in a reduction in the operating speed if the cell has severe programming time requirements. In the configuration shown in FIG. 17, on the other hand, since the threshold voltage Vth of the load transistor LD1 is low, the time required to increase the potential of the storage node NT from a low level to a high level is reduced, allowing the operating speed to be increased.

Fifth Embodiment

Figure 20:
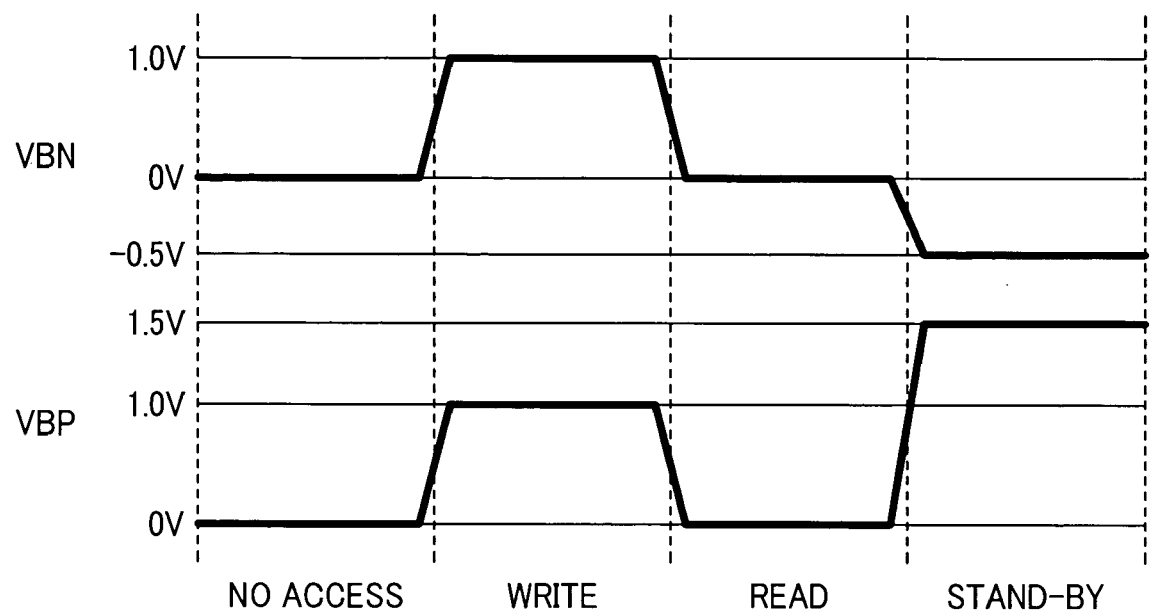
FIG. 20 is a diagram showing the voltage relationship between well nodes in SRAM according to the present invention.

FIG. 20 shows an example of how to control the well potentials of an SRAM memory cell according to a fifth embodiment of the present invention. The fifth embodiment (shown in FIG. 20) is different from the first embodiment in that it includes a stand-by mode or state. In this state, the memory cell stores data but is not accessed. In this case, to reduce the total power consumption of the memory cell, it is necessary to reduce the transistor leakage current. In the stand-by state, the well potentials of the nMOS transistors are adjusted to −0.5 V (a negative voltage), and the well potentials of the pMOS transistors are adjusted to 1.5 V (higher than the power supply voltage Vdd (high level)). As a result, the threshold voltages Vth of the nMOS and pMOS transistors are adjusted to be higher, as compared to when the well potentials of these transistors are set equal to their respective source potentials, allowing for a large reduction in the leakage current flowing between their source and drain (referred to as the "subthreshold leakage current). Although in the above example the well potentials of the nMOS transistors and pMOS transistors are set to −0.5 V and 1.5 V, respectively, the well potentials of the nMOS transistors may be set to lower than −0.5 V and those of the pMOS transistors may be set to higher than 1.5 V in order to further increase their threshold voltages Vth.

Figure 21:
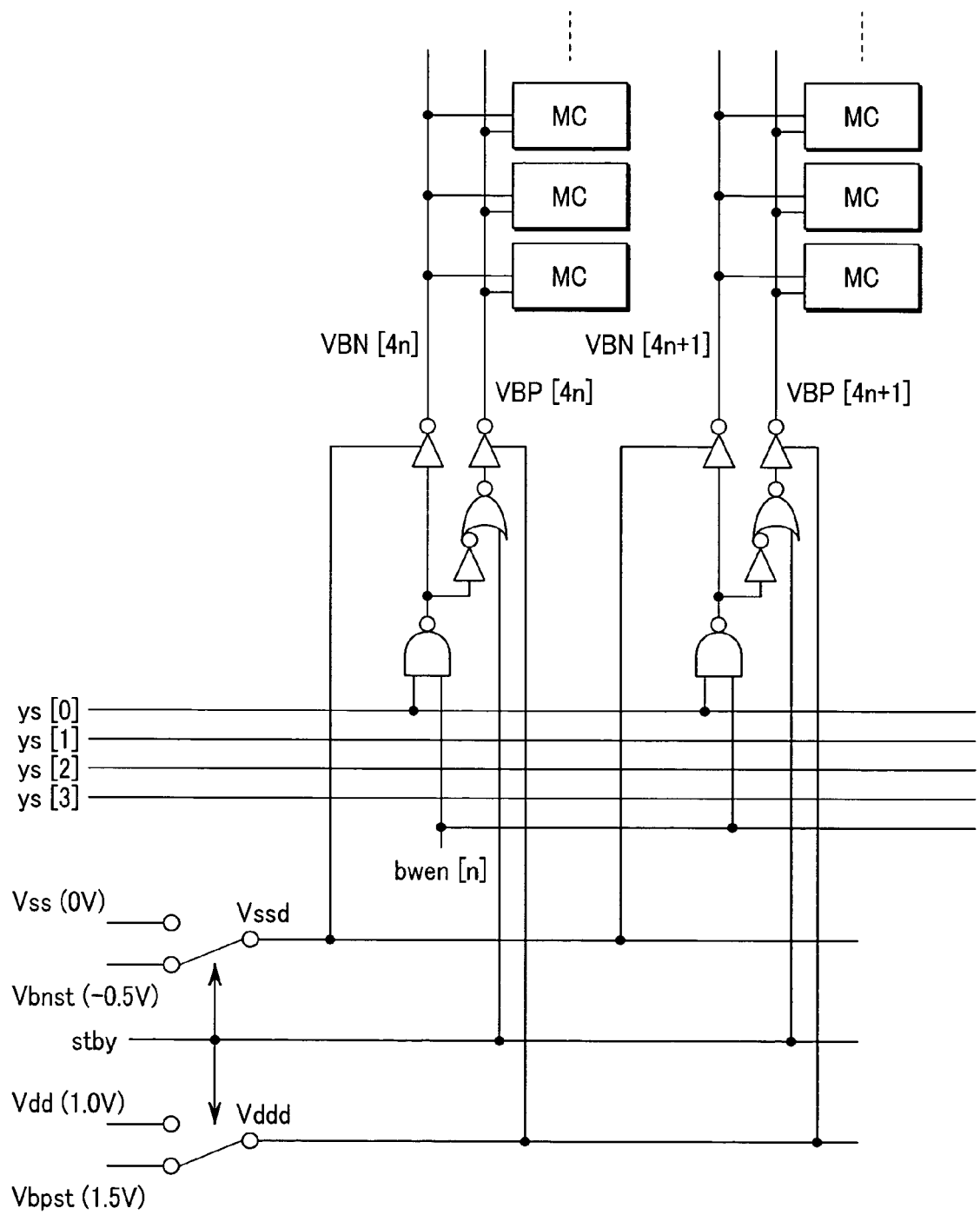
FIG. 21 is a schematic diagram showing a circuit for controlling well nodes of SRAM according to the present invention.

FIG. 21 is a circuit diagram showing the configuration of an SRAM circuit for achieving the potential state shown in FIG. 20. In FIG. 21, symbol Vssd denotes a low level power supply line of the drive circuit for controlling the well potentials of the transistors within the memory cells; Vddd, a high level power supply line of the drive circuit for controlling the well potentials of the transistors within the memory cells; Vbnst, the well potential of the nMOS transistors in the stand-by state (in this example, −0.5 V); Vbpst, the well potential of the pMOS transistors in the stand-by state (in this example, 1.5 V); and stby, a stand-by signal, which is set high when the memory cells are in the stand-by state. When the memory cells are not in the stand-by state, the power supply lines Vssd and Vddd are set to 0 V and 1.0 V (ordinary voltages), respectively, and therefore these memory cells operate in the same manner as described in connection with the first embodiment. When the stand-by signal stby is set high and thereby the memory cells are put in the stand-by state, the power supply lines Vssd and Vddd are set to −0.5 V and 1.5 V, respectively, and the well potentials of the NMOS and pMOS transistors within the memory cells are adjusted to −0.5 V and 1.5 V, respectively, thereby increasing the threshold voltages Vth of these transistors and reducing the subthreshold leakage current.

Sixth Embodiment

Figure 22:
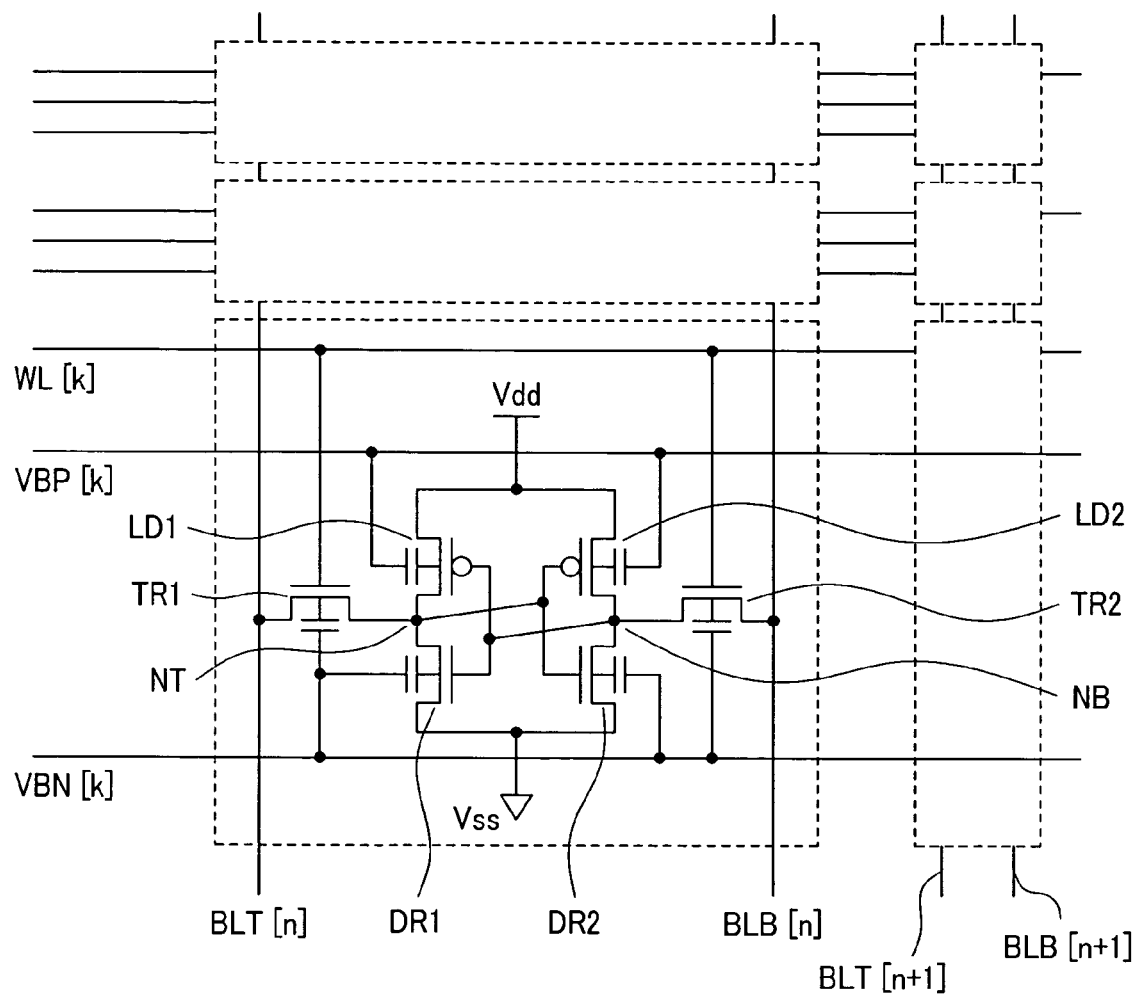
FIG. 22 is a schematic diagram showing the circuit configuration of an SRAM memory cell according to the present invention.

FIG. 22 is a circuit diagram showing an SRAM circuit according to a sixth embodiment of the present invention. The first embodiment provides a circuit configuration suitable for an SRAM circuit employing memory cells that have a rectangular shape elongated in the word line direction. (These memory cells are commonly referred to as "laterally extending cells.") In a laterally extending cell, n- and p-wells that are elongated in a direction perpendicular to the word line are alternately arranged in the word line direction. As a result, the memory cell has a rectangular shape elongated in the word line direction, as described above. The present invention, on the other hand, provides a circuit configuration for an SRAM circuit employing memory cells that have a rectangular shape elongated in the bit line direction. In this type of cell ("longitudinally extending cell"), n- and p-wells that are elongated in a direction perpendicular to the bit lines are alternately arranged in the bit line direction. As a result, the memory cell has a rectangular shape elongated in the bit line direction, as described above. In FIG. 22, symbol WL[k] denotes the kth-row word line; VBN[k], the well node common to the nMOS transistors in the kth-row memory cells; and VBP[k], the well node common to the pMOS transistors in the kth-row memory cells. This circuit configuration is different from the SRAM circuit of the first embodiment for laterally extending cells shown in FIG. 1 in that the well nodes VBN[k] and VBP[k] extend parallel to the word line WL[k].

Figure 23:
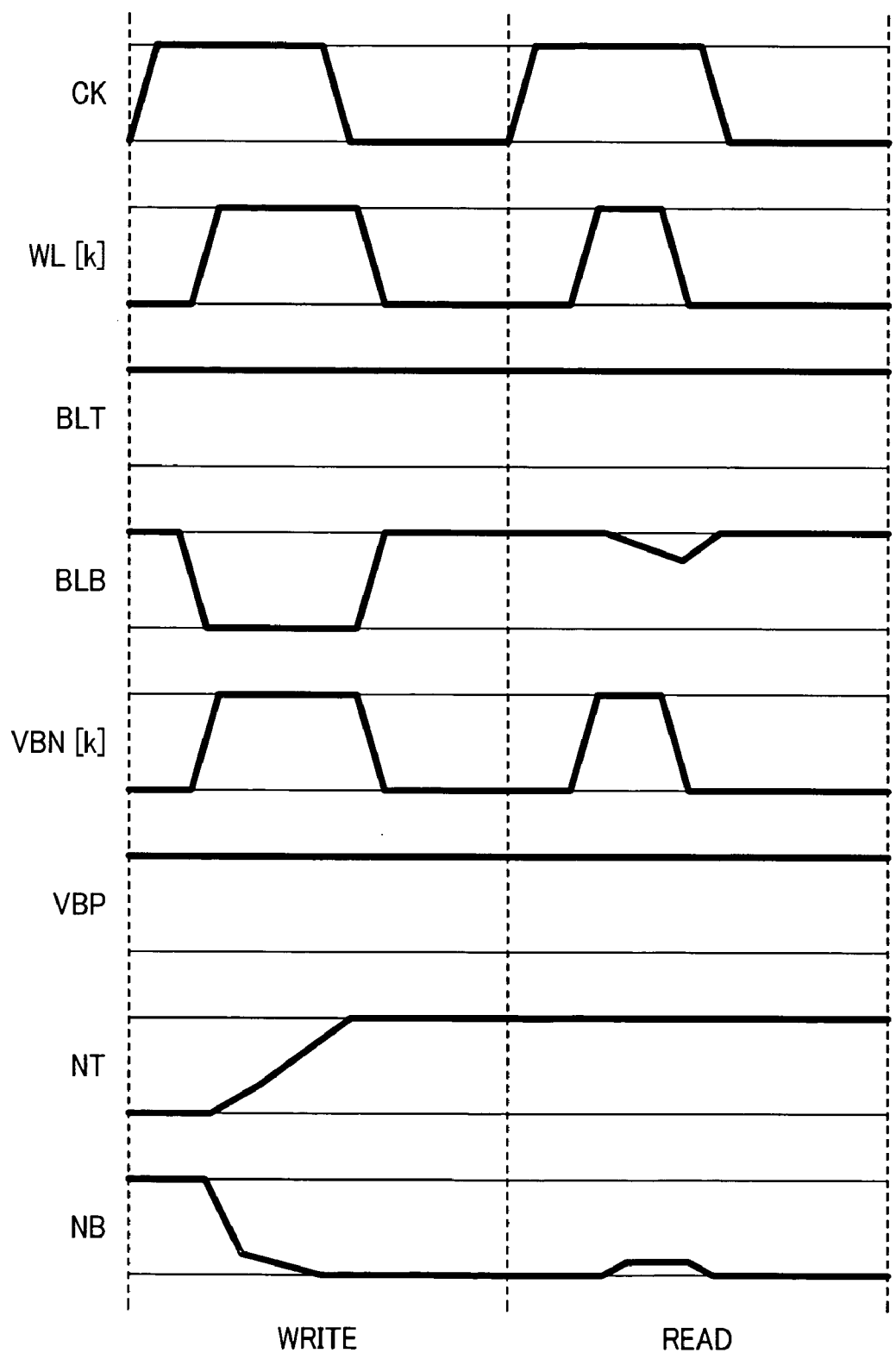
FIG. 23 is a diagram showing changes in the potential of each node in SRAM according to the present invention.

FIG. 23 shows changes in the potential of each portion (or node) of the circuit. When the potential of the word line rises, the potential of the well node VBN for the nMOS transistors rises to a high level, resulting in a reduction in the threshold voltages Vth of the nMOS transistors and an increase in their driving power. This causes the current of the nMOS transistors to increase, leading to improved programming characteristics. Furthermore, a high-speed read operation can be achieved, since there is also an increase in the current of the nMOS transistors when the memory cell is read. The potential of the well node for the pMOS transistors is constantly set to a high level to prevent an increase in the current of these transistors in a write operation and thereby prevent degradation of the programming, or write, characteristics.

Figure 24:
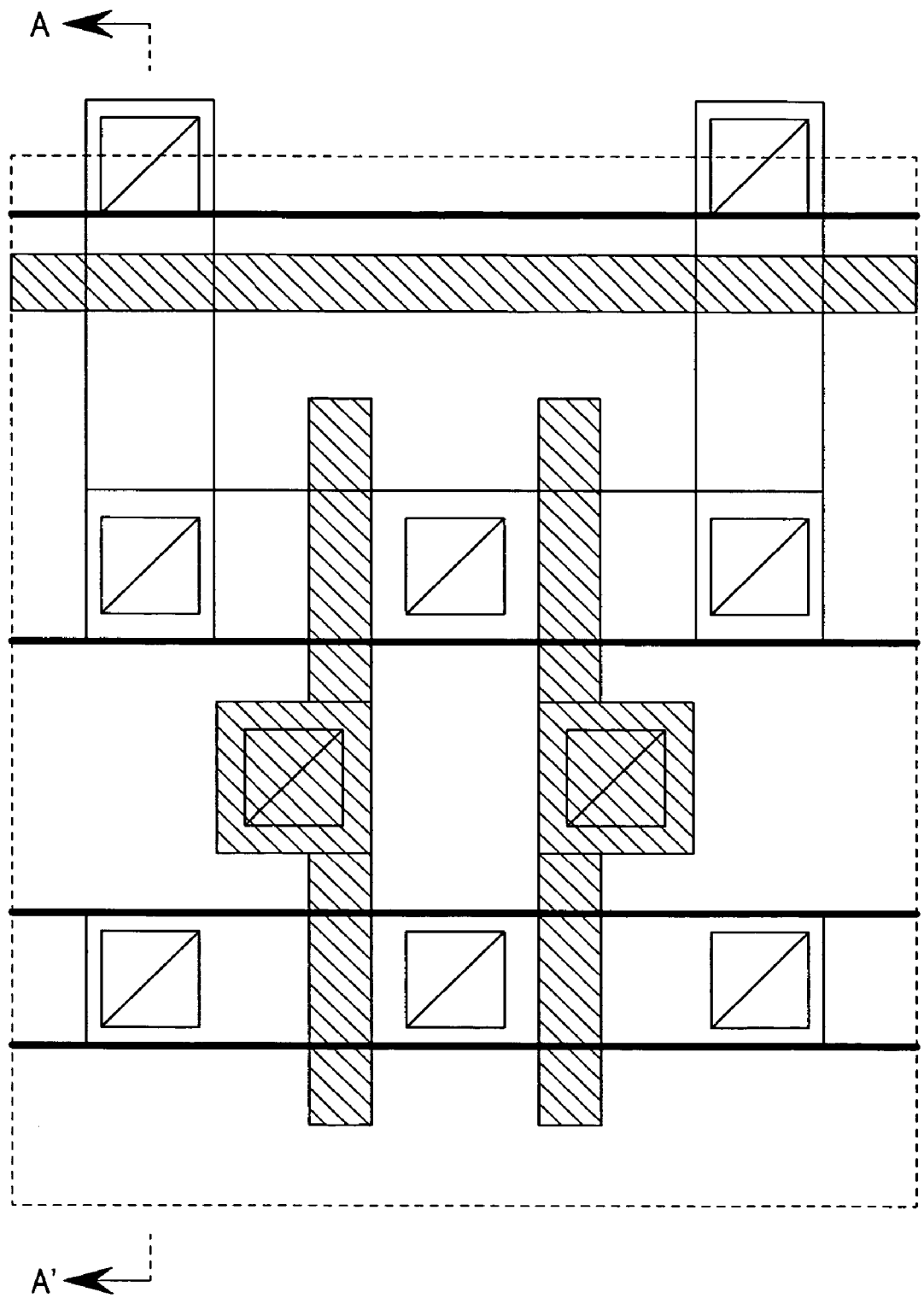
FIG. 24 is a schematic diagram showing an SRAM memory cell layout according to the present invention.

FIG. 24 is a diagram showing a memory cell layout. In the figure, each well is designated and enclosed by thick lines. Unlike the configuration shown in FIG. 5, these memory cells (or "longitudinally extending cells") have a configuration in which n- and p-wells are alternately arranged in the bit line direction. (As a result, each memory cell has a rectangular shape elongated in the bit line direction.) Since they have such a shape, the well nodes VBN[k] and VBP[k] extend parallel to the word line WL[k], as shown in FIG. 22.

Figure 25:
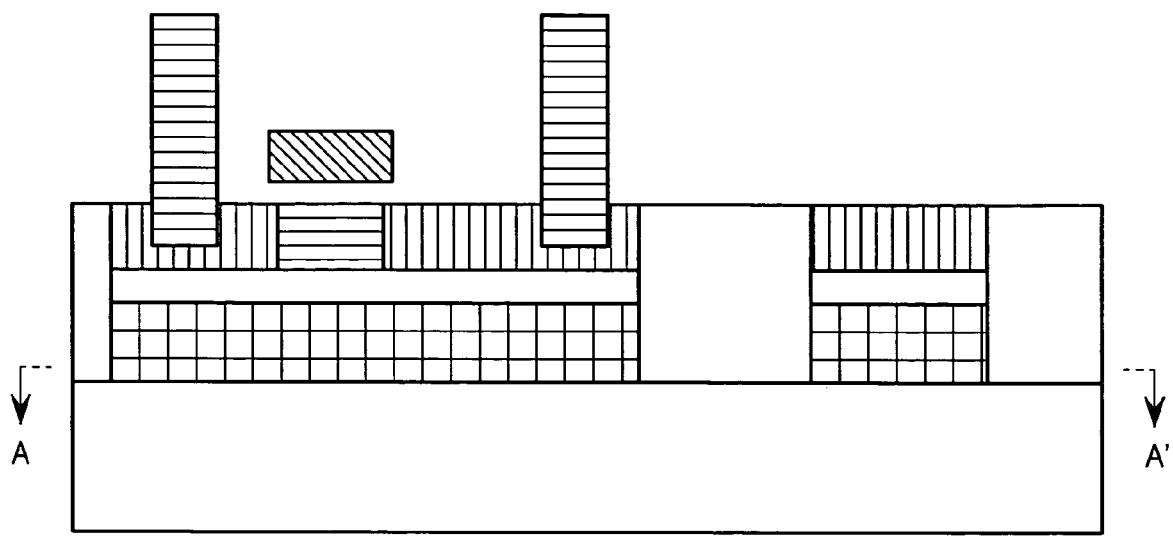
FIG. 25 is a cross-sectional view of an SRAM memory cell according to the present invention.

FIG. 25 is a cross-sectional view of the layout taken along line A-A' of FIG. 24. As can be seen from the figure, the well nodes of the nMOS transistors are connected to each other, and so are the well nodes of pMOS transistors.

Seventh Embodiment

Figure 26:
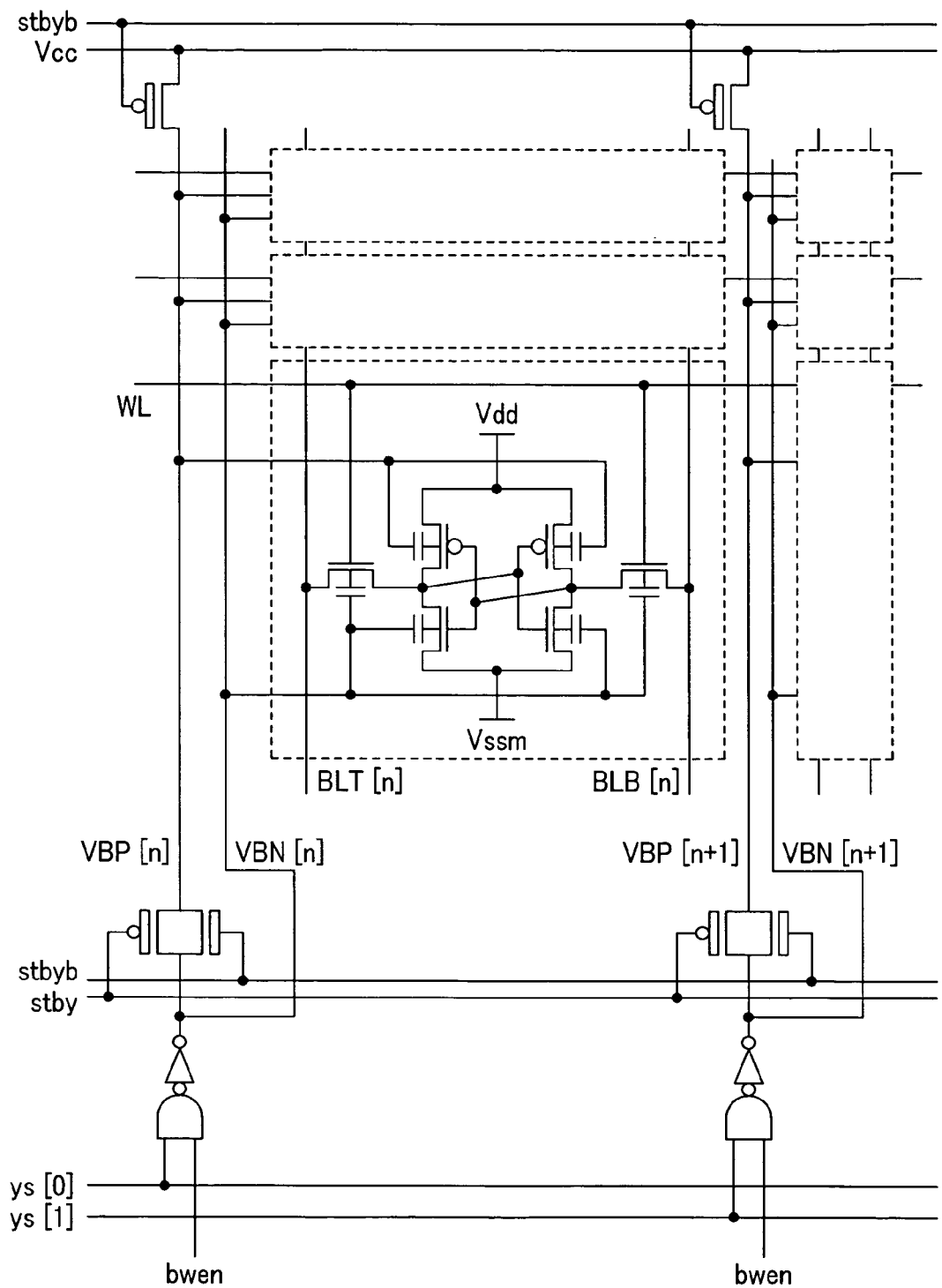
FIG. 26 is a schematic diagram showing a circuit for controlling well nodes of SRAM according to the present invention.

FIG. 26 is a circuit diagram showing an SRAM circuit according to a seventh embodiment of the present invention. In the figure, Vssm denotes a node to which is connected the source electrodes of the drive transistors within each memory cell; Vcc, a power supply line having a higher potential than the power supply line Vdd; and stby and stbyb, stand-by signals supplied when the memory cell is put in the stand-by state. The portion of the circuit shown below in FIG. 26 includes two transistors High-Tox whose gate electrode connection portion is indicated by a rectangular box (not a line). These transistors are thick film transistors. The thickness of their gate oxide layer (Tox) is larger, as compared to the other transistors, and therefore they are not damaged even if a voltage higher than the voltage Vdd is applied to their gate electrodes, etc. This type of transistor is used in the input/output circuit of a general LSI for interfacing with an external device. The power supply line Vcc supplies one of the voltages commonly used by input/output circuits of general LSIs, such as 1.8 V, 2.5 V, or 3.3 V. The following description of the present embodiment assumes this voltage to be 2.5 V. However, other voltage may be used, with the same effect. Symbols stby and stbyb denote signals used to indicate the stand-by state, and when the memory cell is put in the stand-by state, the signal stby is set high and the signal stbyb is set low.

Figure 27:
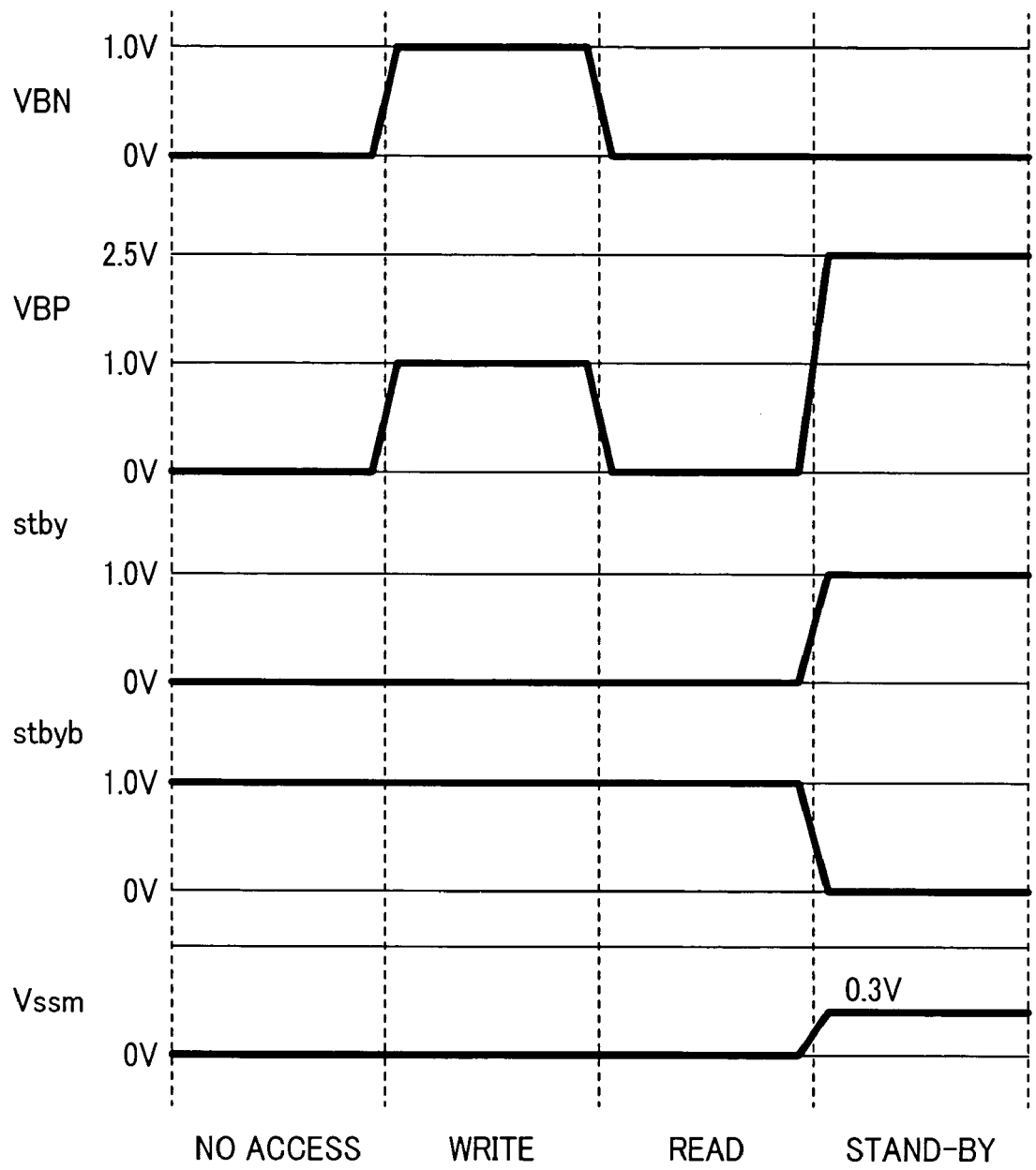
FIG. 27 is a diagram showing the voltage relationship between nodes in SRAM according to the present invention.

FIG. 27 shows the potential of each portion (or node) of the circuit in each operating state. The circuit of the present embodiment operates in the same manner as the circuit of the first embodiment except for the stand-by state. In the stand-by state, the potential of the node VBN is set to 0 V, as in the first embodiment. However, the potentials of the nodes VBP and Vssm are different than in the first embodiment. Specifically, the potential of the node Vssm is adjusted to approximately 0.3 V, thereby putting the nMOS transistors in the same state as when a back bias is applied to them. This can significantly reduce the subthreshold leakage current (specifically, by a factor of 10 or more). Further, the gate leakage current flowing from the gate electrodes of the nMOS and pMOS transistors to the channels is also considerably reduced since the electric field is reduced. When the potential of the node Vssm is adjusted (as described above), the source-drain voltage of the pMOS transistors is reduced by approximately one-third and, therefore, the leakage current of the pMOS transistors is also reduced by only approximately one-third, since the leakage current is substantially proportional to source-drain the voltage. In the circuit of the present embodiment, a potential of 2.5 V is applied to the well nodes of the pMOS transistors. This increases the threshold voltages Vth of the pMOS transistors by approximately 200 mV, allowing the subthreshold leakage current to be reduced by a factor of 100 or more. Therefore, it is possible to significantly reduce the (total) leakage current in the stand-by state.

In the above arrangement of the present embodiment, when well nodes of transistors need to be set to a higher voltage than the power supply voltages of the SRAM, the power supply voltage used by the input/output circuit of the LSI is applied to these well nodes. This eliminates the need for an additional circuit to generate a high voltage, which is advantageous in terms of circuit space and power consumption.

However, the high voltage applied to the well nodes of the pMOS transistors is not limited to the power supply voltage used by the input/output circuit of the LSI. Any voltage higher than the power supply voltages of the SRAM circuit may produce the same effect. Therefore, the LSI may include a circuit for generating a high voltage, or a voltage higher than the power supply voltages of the SRAM may be applied from an external power source to the well nodes of the pMOS transistors.

FIG. 31 shows exemplary relationships among the thickness of the gate oxide layer (Tox), the thickness of the buried oxide layer (Tbox), the power supply voltage (Vdd), and the well potential (VBP) of the pMOS transistors. In the figure, Pattern1 indicates the relationship among the above layer thicknesses and voltages according to the present embodiment. Pattern2 indicates an example in which the maximum allowable voltage is applied to the pMOS transistors to maximize the leakage current reducing effect. Pattern3 indicates an example in which the gate oxide layer thickness is reduced and the power supply voltage is also reduced accordingly. Pattern4 indicates an example in which the buried oxide layer thickness is increased and the well node potential is also increased. Increasing the buried oxide layer thickness results in a smaller change in the threshold voltage Vth when the well node potential is changed. However, increasing the well node potential compensates for this, providing the same performance (as the present embodiment). Pattern 5 indicates an example in which the buried oxide layer thickness is reduced. Although the voltage used by the input/output circuit is applied to the well nodes of the pMOS transistors, this example can achieve substantially the same performance as Pattern2, since the buried oxide layer thickness is reduced to increase the change in the threshold voltage Vth. Pattern6 indicates an example in which the oxide layer thicknesses are the same as in Pattern5 and a voltage higher than the voltage used by the input/output circuit is applied to the well nodes. This example can further reduce the leakage current. Pattern7 indicates an example in which the buried oxide layer thickness is further reduced. Although the well node potential is not so high, this example will lead to a greater reduction in the leakage current than Pattern2.

Eighth Embodiment

Figure 28:
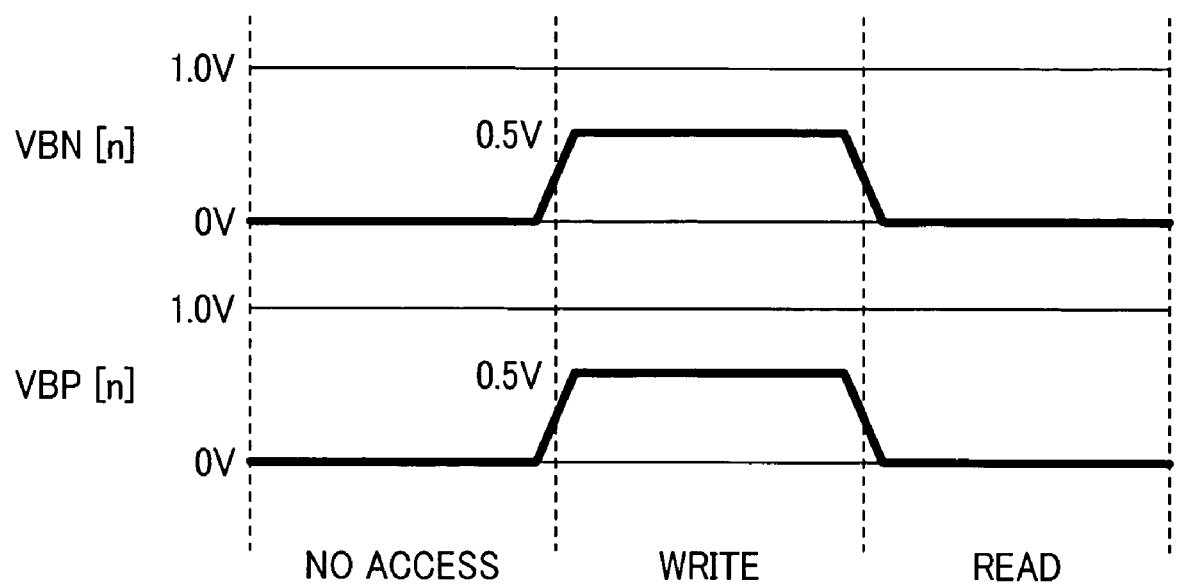
FIG. 28 is a diagram showing the voltage relationship between well nodes in SRAM according to the present invention.

FIG. 28 shows the potentials of transistors within an SRAM memory cell according to an eighth embodiment of the present invention. According to the present embodiment, when the memory cell is programmed, the well potentials are increased from 0 V to only 0.5 V. This reduces the power consumed to control the nodes VBN and VBP. Furthermore, the time required to adjust the potentials of the nodes VBN and VBP can be reduced, speeding up the operation.

Ninth Embodiment

Figure 29:
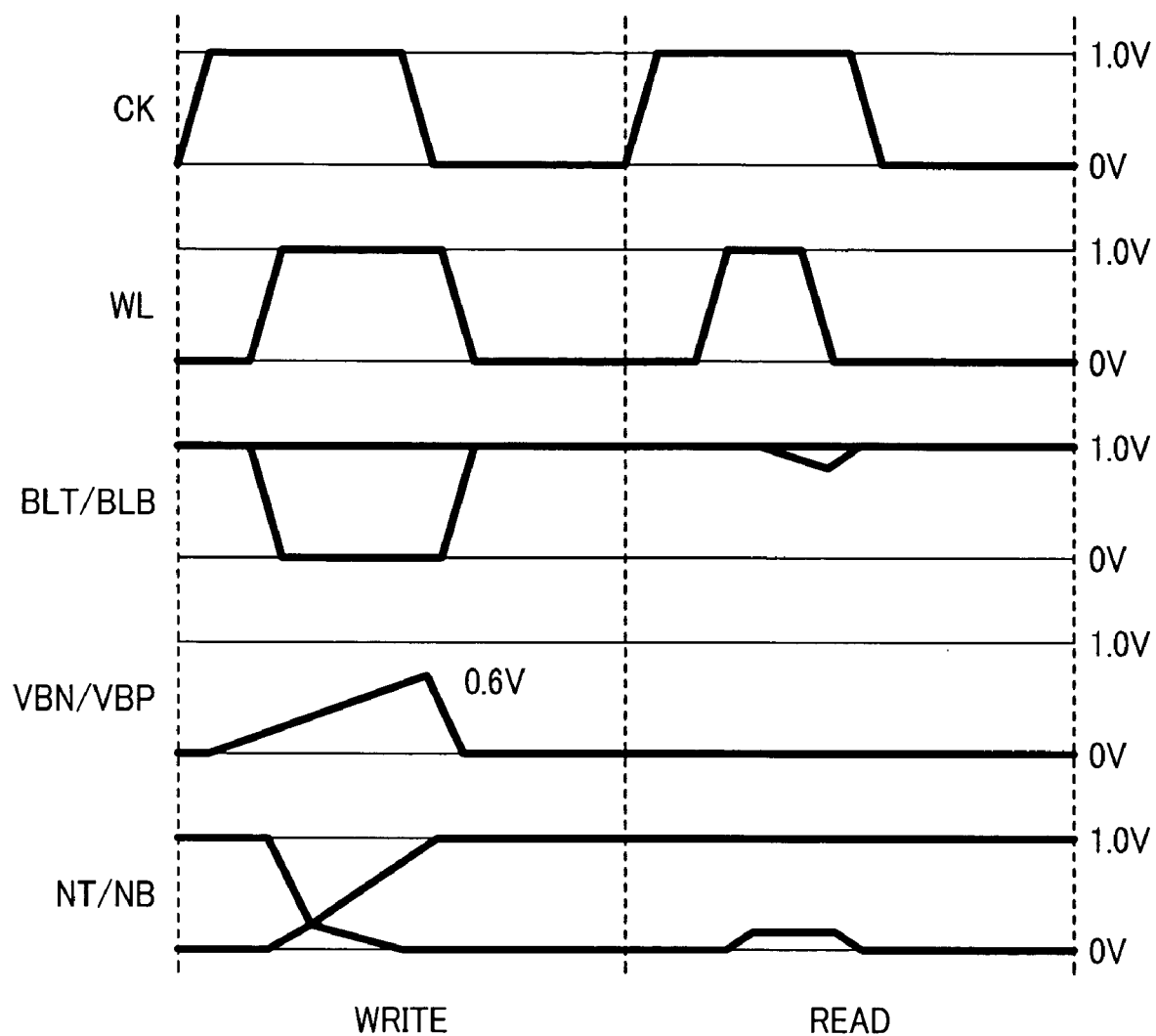
FIG. 29 is a diagram showing changes in the potential of each node in SRAM according to the present invention.

FIG. 29 shows changes in the potential of each portion (or node) of an SRAM circuit according to a ninth embodiment of the present invention. Unlike the first embodiment, in the present embodiment the potentials of the nodes VBN and VBP are increased to only approximately 0.6 V, not to the maximum level, when they are increased. This arrangement reduces the power consumed to control the nodes VBN and VBP, as in the eighth embodiment.

The present embodiment can be implemented by the circuit configuration shown in FIG. 1. However, according to the present embodiment, one modification is made. That is, the driving power of the drive circuits for driving the nodes VBN and VBP is reduced. The first embodiment requires drive circuits having high driving power to quickly change the potentials of the nodes VBN and VBP. On the other hand, the present embodiment allows the driving power of the drive circuits to be reduced. This is practically achieved by reducing the gate width of the transistors for driving the nodes VBN and VBP. This arrangement results in smaller circuit space, as compared to the first embodiment.

When the gate electrode of a conventional bulk transistor is driven, if the potential change of the signal is slow, hot carriers are generated, resulting in degraded reliability of the LSI, etc. On the other hand, the circuit of the present embodiment does not have the problem of generation of hot carriers and other reliability problems, since in this circuit the well potentials are changed instead of the gate electrode potential.

Tenth Embodiment

FIG. 30 shows possible potential relationships between the well nodes VBN and VBP of a memory cell within an SRAM circuit in read, write, and stand-by states according to the present invention. Referring to the figure, Pattern1 indicates an exemplary potential relationship according to the first embodiment.

Pattern2 indicates an example in which unlike the first embodiment, the potential Vbn (of the node VBN) is adjusted to 1.0 V also in a read operation. This increases the current of the nMOS transistors, thereby increasing the speed of the read operation.

Pattern3 indicates an example in which the potential of the node VBP is adjusted to 2.5 V in the stand-by state to increase the threshold voltages Vth of the pMOS transistors and thereby significantly reduce the leakage current.

Pattern4 indicates an example that is different from Pattern3 in that the node VBN is set to a negative potential in the stand-by state. This increases the threshold voltages Vth of the nMOS transistors, thereby further reducing the leakage current.

Pattern5 indicates an example in which the potential of the node VBN is increased to 2.5 V in a write operation to significantly reduce the threshold voltages Vth of the nMOS transistors. As a result, the currents of the nMOS transistors are larger than in Pattern1, improving the programming characteristics and increasing the operating speed.

Pattern6 indicates an example in which the potential of the node VBN in a read operation is increased to 2.5 V to significantly reduce the threshold voltages Vth of the nMOS transistors. As a result, the currents of the nMOS transistors are larger than in Pattern2, considerably increasing the memory cell current in the read operation and improving the operating speed.

The preferred embodiments described above allow speed-up of transistor operation and reduction of leakage currents. Further, they also increase the operating margins of SRAM circuits and thereby improve their operating characteristics. Furthermore, it is possible to prevent an increase in the memory cell area.

The following are reference numerals used in the drawings of this specification.

TR1, TR2, 201, 202 . . . transfer transistor
DR1, DR2, 203, 204 . . . drive transistor
LD1, LD2, 205, 206 . . . load transistor
NT, NB, 207, 208 . . . data storage node within memory cell
WL . . . word line
Vdd . . . power supply line
Vss . . . ground potential
LT, BLB, BLT[n], BLB[n], BLT[n+1], BLB[n+1] . . . bit line
VBN, VBN[n], VBN[n+1], VBN1, VBN2, VBN[4n], VBN[4n+1], VBN[4n+2], VBN[k], VBN1[n], VBN2[n] . . . nMOS well node
VBP, VBP[n], VBP[n+1], VBP1, VBP2, VBP[4n], VBP[4n+1], VBP[4n+2], VBP[k], VBP1[n], VBP2[n] . . . pMOS well node
1, 11 . . . gate electrode
2 . . . drain electrode
3 . . . source electrode
4, 17, Well . . . well
5, 18 . . . substrate
6, 16 . . . buried oxide layer
7, 13 . . . trench isolation layer
12, Contact . . . contact
19, Diffusion . . . diffusion layer
14 . . . gate insulation layer
15 . . . SOI layer
MC . . . memory cell
ys, ys[0] to ys[3] . . . column selection signal
DRV1 . . . well node driver
in . . . input signal
WDR . . . word line driver
xa, xb . . . address decoded signal
CK . . . clock signal
bwen . . . write signal
D . . . input data
Vssd . . . Vss line of well node driver
Vddd . . . Vdd line of well node driver
Vbnst, Vbpst . . . well node potential line for stand-by mode
stby, stbyb . . . stand-by state control signal
Vssm . . . drive transistor source line within memory cell
Vcc . . . power supply line having a higher potential than Vdd
SOC . . . system LSI chip
CPU . . . CPU core
CACHE . . . cache memory
RAM . . . working memory
PERI . . . logic circuitry outside CPU core within system LSI

What is claimed is:

1. A semiconductor memory device comprising:
a static memory cell including a latch portion and a transfer portion, said latch portion storing data, said transfer portion transferring said data;
wherein said latch and transfer portions each include a transistor formed above a well layer; and
wherein a voltage which is supplied to a well layer in a data read operation from said static memory cell is different from a voltage which is supplied to said well layer in a data write operation to said static memory cell,
wherein said latch portion includes a pair of drive transistors each having a channel of a first conductive type and a pair of load transistors each having a channel of a second conductive type, each drive transistor having a source electrode connected to a source line, each load transistor having a source electrode connected to a first power supply line higher in potential than said source line; and wherein said transfer portion includes a pair of transfer transistors each having a channel of said first conductive type and connected between a bit line for accessing said memory cell and a storage node for storing data, and a gate connected to a word line across the bit line, wherein a second power supply line for applying, as necessary, the voltage to the well layer when data is written to or read from said memory cell, said well layer being made up of a conductive layer, said second power supply line extending in a direction across the word line.

2. The semiconductor memory device as claimed in claim 1, wherein at least one transistor in said memory cell has an FD-SOI structure in which an SOI layer is fully depleted.

3. The semiconductor memory device as claimed in claim 1, wherein the threshold voltage of a transistor in said latch portion is changed.

4. The semiconductor memory device as claimed in claim 1, wherein the threshold voltage of a transistor in said transfer portion is changed.

5. The semiconductor memory device as claimed in claim 1, wherein the threshold voltages of said load transistors are adjusted to be higher when said memory cell is written than when said memory cell is read.

6. The semiconductor memory device as claimed in claim 1, wherein the threshold voltages of said transfer transistors are adjusted to be lower when said memory cell is written than when said memory cell is read.

7. The semiconductor memory device as claimed in claim 1, wherein the threshold voltages of said drive transistors are adjusted to be lower when said memory cell is written than when said memory cell is read.

8. The semiconductor memory device as claimed in claim 1, wherein the well potentials of said load transistors are adjusted to be higher when said memory cell is written than when said memory cell is read.

9. The semiconductor memory device as claimed in claim 1, wherein the well potentials of said transfer transistors are adjusted to be higher when said memory cell is written than when said memory cell is read.

10. The semiconductor memory device as claimed in claim 1, wherein the well potentials of said drive transistors are adjusted to be higher when said memory cell is written than when said memory cell is read.

11. The semiconductor memory device as claimed in claim 1, wherein when said memory cell is in a stand-by state in which said memory cell stores data but is not accessed, the well potentials of said load transistors are adjusted to be higher than the potential of said first power supply line.

12. The semiconductor memory device as claimed in claim 1, wherein when said memory cell is in a stand-by state in which said memory cell stores data but is not accessed, the well potentials of said drive and transfer transistors are adjusted to be negative and lower than the potential of said source line.

13. The semiconductor memory device as claimed in claim 1, wherein each of said transistors included in said latch and transfer portions is formed in an SOI layer whose channel portion is insulated from a substrate portion by a BOX layer made up of an insulation layer.

* * * * *